United States Patent
Kawabe et al.

(10) Patent No.: US 11,130,861 B2
(45) Date of Patent: Sep. 28, 2021

(54) SOLUBLE POLYFUNCTIONAL VINYL AROMATIC COPOLYMER, METHOD FOR PRODUCING SAME, CURABLE RESIN COMPOSITION AND CURED PRODUCT THEREOF

(71) Applicant: NIPPON STEEL Chemical & Material Co., Ltd., Tokyo (JP)

(72) Inventors: Masanao Kawabe, Tokyo (JP); Shinichi Iwashita, Tokyo (JP)

(73) Assignee: NIPPON STEEL Chemical & Material Co., Ltd., Tokyo (JP)

(*) Notice: Subject to any disclaimer, the term of this patent is extended or adjusted under 35 U.S.C. 154(b) by 179 days.

(21) Appl. No.: 16/498,378

(22) PCT Filed: Mar. 29, 2018

(86) PCT No.: PCT/JP2018/013508
§ 371 (c)(1),
(2) Date: Sep. 26, 2019

(87) PCT Pub. No.: WO2018/181842
PCT Pub. Date: Oct. 4, 2018

(65) Prior Publication Data
US 2021/0108073 A1    Apr. 15, 2021

(30) Foreign Application Priority Data

Mar. 30, 2017 (JP) .............................. JP2017-068100

(51) Int. Cl.
| | |
|---|---|
| *C08L 71/12* | (2006.01) |
| *C08K 5/03* | (2006.01) |
| *C08L 25/08* | (2006.01) |
| *C08L 63/00* | (2006.01) |
| *C09D 125/08* | (2006.01) |
| *H05K 1/03* | (2006.01) |
| *C08F 212/34* | (2006.01) |
| *C08F 212/06* | (2006.01) |
| *C08F 212/08* | (2006.01) |
| *C08F 212/36* | (2006.01) |
| *C08F 4/14* | (2006.01) |

(52) U.S. Cl.
CPC ............ *C08L 71/12* (2013.01); *C08F 212/06* (2013.01); *C08F 212/08* (2013.01); *C08F 212/34* (2013.01); *C08F 212/36* (2013.01); *C08K 5/03* (2013.01); *C08L 25/08* (2013.01); *C08L 63/00* (2013.01); *C09D 125/08* (2013.01); *H05K 1/0353* (2013.01); *C08F 4/14* (2013.01)

(58) Field of Classification Search
CPC ......... C08L 25/08; C09D 125/08; C08F 4/14; C08F 212/06; C08F 212/08; C08F 212/34; C08F 212/36
See application file for complete search history.

(56) References Cited

U.S. PATENT DOCUMENTS

| | | |
|---|---|---|
| 2007/0129502 A1 | 6/2007 | Kawabe et al. |
| 2007/0155923 A1 | 7/2007 | Kawabe |
| 2011/0065818 A1 | 3/2011 | Mori et al. |

FOREIGN PATENT DOCUMENTS

| | | |
|---|---|---|
| JP | H04239009 | 8/1992 |
| JP | 2004123873 | 4/2004 |
| JP | 2005213443 | 8/2005 |
| JP | 2007332273 | 12/2007 |
| JP | 2008239781 | 10/2008 |
| JP | 2008248001 | 10/2008 |
| JP | 2010209279 | 9/2010 |
| JP | 2010229263 | 10/2010 |
| JP | 2011063728 | 3/2011 |

(Continued)

OTHER PUBLICATIONS

"International Preliminary Report on Patentability of PCT/JP2018/013508; this report contains the following items :Form PCT/IB/338,PCT/IB/373, PCT/ISA237(cover sheet), PCT/ISA237(Box No. I), PCT/ISA237(Box No. V), PCT/ISA237(Supplemental Box)", dated Oct. 10, 2019, p. 1-p. 7.

(Continued)

*Primary Examiner* — Kregg T Brooks
(74) *Attorney, Agent, or Firm* — JCIPRNET

(57) ABSTRACT

A novel soluble polyfunctional vinyl aromatic copolymer capable of yielding a cured product or molded body having improved heat resistance, compatibility, dielectric properties, wet heat reliability and resistance to thermal oxidative degradation. Disclosed herein is a soluble polyfunctional vinyl aromatic copolymer containing structural units derived from a divinyl aromatic compound (a), styrene (b), and a monovinyl aromatic compound (c) other than styrene. The copolymer includes structural units made up of an unsaturated hydrocarbon group represented by Formula (a1) and derived from the divinyl aromatic compound (a); and the copolymer includes, at terminals thereof, predetermined amounts of specific terminal groups having a vinyl group or a vinylene bond derived from monomers (a), (b), and (c). Also disclosed is a method for producing the copolymer.

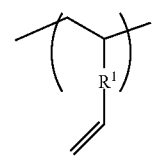

(a1)

20 Claims, No Drawings

(56) References Cited

FOREIGN PATENT DOCUMENTS

| JP | 2018039995 | 3/2018 |
|---|---|---|
| WO | 2005073264 | 8/2005 |
| WO | 2017115813 | 7/2017 |

OTHER PUBLICATIONS

"International Search Report (Form PCT/ISA/210) of PCT/JP2018/013508," dated Jun. 26, 2018, with English translation thereof, pp. 1-4.

SOLUBLE POLYFUNCTIONAL VINYL AROMATIC COPOLYMER, METHOD FOR PRODUCING SAME, CURABLE RESIN COMPOSITION AND CURED PRODUCT THEREOF

CROSS-REFERENCE TO RELATED APPLICATION

This application is a 371 application of the international PCT application serial no. PCT/JP2018/013508, filed on Mar. 29, 2018, which claims the priority benefit of Japan application no. 2017-068100, filed on Mar. 30, 2017. The entirety of each of the abovementioned patent applications is hereby incorporated by reference herein and made a part of this specification.

TECHNICAL FIELD

The present invention relates to a novel soluble polyfunctional vinyl aromatic copolymer having improved heat resistance, compatibility, dielectric properties, wet heat reliability, and resistance to thermal oxidative degradation, to a method for producing the copolymer, and to a curable resin composition containing the copolymer.

BACKGROUND ART

Communication of information at high-frequency bands has developed briskly as the increase in information communication volumes in recent years. In order to have more excellent electrical characteristics, in particular, to reduce transmission loss at high-frequency bands, electrical insulating materials that have low permittivity and low dielectric tangent and, in particular, exhibit small changes in dielectric properties after absorption of moisture have been demanded. Furthermore, materials that exhibit high heat resistance, i.e. a high glass transition temperature are desired due to the fact that a printed board or electronic component in which such electrical insulating materials are used is exposed to high-temperature solder reflow during mounting. In particular, electrical insulating materials of yet higher heat resistance have come to be in high demand recently since the use of lead-free solder having a high melting point owing to environmental issues. To meet the above demands, curing resins that utilize vinylic compounds having various chemical structures have conventionally been proposed.

As such a curing resin, for instance PTL 1 discloses a soluble polyfunctional vinyl aromatic copolymer that is obtained through polymerization of a divinyl aromatic compound and a monovinyl aromatic compound in an organic solvent, in the presence of a Lewis acid catalyst and an initiator of specific structure, such as 1-chloroethylbenzene, 1-bromoethylbenzene, or bis(1-chloro-1-methylethyl)benzene, at a temperature of 20° C. to 100° C. PTL 2 discloses a method for producing a soluble polyfunctional vinyl aromatic copolymer having a controlled molecular weight distribution, resulting from cationic polymerization, at a temperature of 20° C. to 120° C., of a monomer component containing 20 to 100 mol % of a divinyl aromatic compound using a Lewis acid catalyst and an initiator of specific structure in the presence of a quaternary ammonium salt. The soluble polyfunctional vinyl aromatic copolymers obtained according to the techniques disclosed in these two patent documents exhibit excellent solvent solubility and processability, and a cured product having a high glass transition temperature and excellent heat resistance can be obtained using the copolymers.

The soluble polyfunctional vinyl aromatic copolymers obtained in accordance with these techniques have themselves polymerizable double bonds, and accordingly curing of such a copolymer yields a cured product having a high glass transition temperature. Therefore, the cured product or soluble polyfunctional vinyl aromatic copolymer can be regarded herein as a polymer having excellent heat resistance, or as a precursor of such a polymer. The soluble polyfunctional vinyl aromatic copolymer yields a cured product through copolymerization with another radically-polymerizable monomer. This cured product as well constitutes a polymer having excellent heat resistance.

However, in terms of the dielectric properties of the soluble polyfunctional vinyl aromatic copolymers disclosed in the above citations, and also from the viewpoint of thermal discoloration resistance and changes in dielectric properties upon continued use at high temperatures, after curing, it is not found that the disclosed soluble polyfunctional vinyl aromatic copolymers exhibit sufficient dielectric properties, or sufficient thermal discoloration resistance and resistance to thermal oxidative degradation when used continuously at high temperatures.

PTL 3 discloses a soluble polyfunctional vinyl aromatic copolymer that is a copolymer obtained through copolymerization of a divinyl aromatic compound and a monovinyl aromatic compound, the copolymer having a chain hydrocarbon group or aromatic hydrocarbon group at part of terminal groups thereof, via an ether bond or thioether bond. However, polar compounds such as chain hydrocarbon compounds and aromatic hydrocarbon compounds having an alcoholic hydroxy group, and chain hydrocarbon compounds and aromatic hydrocarbon compounds having a thioalcoholic mercapto group, are used in order to regulate the molecular weight of these soluble polyfunctional vinyl aromatic copolymers, and therefore the copolymers contain, at terminals, chain hydrocarbon groups or aromatic hydrocarbon groups as terminal groups, via ether bonds or thioether bonds. In consequence, it can hardly be asserted that the copolymers are suitable as substrate materials used in advanced technology fields where high-level dielectric properties are demanded.

PTL 4 and PTL 5 disclose polyfunctional vinyl aromatic copolymers having terminal groups derived from aromatic ether compounds and disclose soluble polyfunctional vinyl aromatic copolymers having terminal groups derived from thio(meth)acrylate-based compounds. Although the soluble polyfunctional vinyl aromatic copolymers disclosed in these citations exhibit improved toughness, the copolymers do not exhibit, however, low dielectric properties at high-frequency bands that accompany the increase in information communication volumes in recent years, and are arguably not deemed to be suitable for fields of advanced technology in which high-level electrical characteristics and thermo-mechanical characteristics are required, with high performance, as in the field of advanced electrical/electronics.

PTL 6 discloses a curable resin composition made up of a polyphenylene ether oligomer having vinyl groups at both terminals, and a polyfunctional vinyl aromatic copolymer that has structural units derived from monomers including a divinyl aromatic compound and an ethyl vinyl aromatic compound. A curable resin composition that utilizes the above soluble polyfunctional vinyl aromatic copolymer, however, exhibits insufficient interlayer peel strength, plating peel strength, and dielectric properties following a wet heat history, and accordingly has the drawback of not being usable as a substrate material in the field of advanced electronic devices.

CITATION LIST

Patent Literature

[PTL 1] Japanese Patent Application Publication No. 2004-123873
[PTL 2] Japanese Patent Application Publication No. 2005-213443
[PTL 3] Japanese Patent Application Publication No. 2007-332273
[PTL 4] Japanese Patent Application Publication No. 2010-229263
[PTL 5] Japanese Patent Application Publication No. 2010-209279
[PTL 6] WO 2005/73264

SUMMARY OF INVENTION

The present invention provides a novel soluble polyfunctional vinyl aromatic copolymer capable of yielding a cured product or molded body having improved heat resistance, dielectric properties, wet heat reliability, and resistance to thermal oxidative degradation, and to provide a method for producing the copolymer, as well as a curable resin composition that contains the copolymer. The present invention further provides a cured body obtained through curing of the curable resin composition containing the copolymer, a curable composite material made up of the curable resin composition and a base material, a cured body of the curable composite material, a laminate made up of the cured body and a metal foil, and a metal foil with resin.

The present invention is a soluble polyfunctional vinyl aromatic copolymer being a polyfunctional vinyl aromatic copolymer that contains 2 mol % or more and less than 95 mol % of structural units derived from a divinyl aromatic compound (a), and contains 5 mol % or more and less than 98 mol % of structural units derived from styrene (b) and a monovinyl aromatic compound (c) other than styrene, wherein the copolymer satisfies the following conditions:
the copolymer contains structural units represented by Formula (a1) and derived from the divinyl aromatic compound (a):

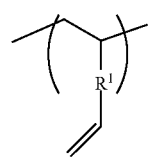

(a1)

in the formula, $R^1$ represents a C6 to C30 aromatic hydrocarbon group;
the copolymer contains, at a terminal thereof, a terminal group represented by Formulae (t1), (t2), and (t3) and derived from the divinyl aromatic compound (a), styrene (b), and the monovinyl aromatic compound (c) other than styrene:

(t1)

in the formula, $R^2$ represents a C6 to C30 aromatic hydrocarbon group; $Z^1$ represents a vinyl group, a hydrogen atom or a C1 to C18 hydrocarbon group; and * represents a bonding site with a main chain; the same applies hereafter;

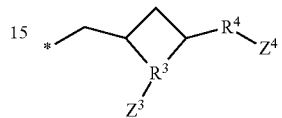

(t2)

in the formula, $R^3$ and $R^4$ represent each independently a C6 to C30 aromatic hydrocarbon group; and $Z^3$ and $Z^4$ represent each independently a vinyl group, a hydrogen atom or a C1 to C18 hydrocarbon group;

(t3)

in the formula, $R^5$ represents a C6 to C30 aromatic hydrocarbon group; and $Z^5$ represents a vinyl group, a hydrogen atom or a C1 to C18 hydrocarbon group;
the mole fraction of the sum total of structural units of Formula (a1) and terminal groups of Formulae (t1), (t2), and (t3) with respect to the sum total of the divinyl aromatic compound (a), styrene (b), and the monovinyl aromatic compound (c) other than styrene lies in the range of 0.02 to 0.8;
an introduction amount in the copolymer of a terminal group (tv) having a vinyl group is 0.2 or more per molecule; and
the mole fraction of Formula (t3) with respect to the sum total of terminal groups of Formulae (t1), (t2), and (t3) is 0.7 or less; and wherein
the copolymer has a number-average molecular weight of 300 to 100,000, a molecular weight distribution (Mw/Mn), denoted by the ratio of weight-average molecular weight and number-average molecular weight, of 100 or lower, and is soluble in toluene, xylene, tetrahydrofuran, dichloroethane or chloroform.

The present invention is also a method for producing a soluble polyfunctional vinyl aromatic copolymer, the method being a method for producing a polyfunctional vinyl aromatic copolymer through polymerization of a divinyl aromatic compound (a), styrene (b), and a monovinyl aromatic compound (c) other than styrene, in the presence of a Lewis acid catalyst (f) and a Lewis base compound (g), wherein the divinyl aromatic compound (a) is used in an amount of 2 mol % or more and less than 95 mol %, and styrene (b) and the monovinyl aromatic compound (c) other than styrene are used in an amount of 5 mol % or more and less than 98 mol %, with respect to the sum total of (a), (b), and (c), and polymerization is carried out at a temperature of −20° C. to 120° C.

In the production method, preferably, the Lewis acid catalyst (f) is a metal fluoride or complex thereof, and preferably the Lewis base compound (g) is one or more types of compound selected from the group consisting of ester-based compounds, ketone-based compounds, and ether-based compounds.

The present invention is also a curable resin composition containing the above soluble polyfunctional vinyl aromatic copolymer, and a radical polymerization initiator (h).

The present invention is also a curable resin composition containing a soluble polyfunctional vinyl aromatic copolymer, and a curable reactive resin or thermoplastic resin. The curable reactive resin is preferably a modified polyphenylene ether compound terminally modified with a substituent having a carbon-carbon unsaturated double bond, an epoxy resin having two or more epoxy groups per molecule, or a vinyl compound having one or more unsaturated hydrocarbon groups in the molecule. Also preferably, the curable resin composition further contains a flame retardant and/or a filler.

Further, the present invention is a cured product obtained through curing of the above curable resin composition or a curable composite material made up of the above curable resin composition and a base material, the proportion of the content of the base material being 5 to 90 wt %, and cured composite material obtained through curing of the above curable composite material. The present invention is also a laminate having a layer of the above cured composite material and a metal foil layer; a metal foil with a resin, having a film formed from the above curable resin composition on one side of a metal foil; or a varnish for circuit board materials, obtained through dissolution of the above curable resin composition in an organic solvent.

The soluble polyfunctional vinyl aromatic copolymer of the present invention, or a cured product obtained from a material that contains the soluble polyfunctional vinyl aromatic copolymer, has improved heat resistance, compatibility, dielectric properties, wet heat reliability and resistance to thermal oxidative degradation. The production method of the present invention allows producing the soluble polyfunctional vinyl aromatic copolymer with high efficiency. By using the soluble polyfunctional vinyl aromatic copolymer of the present invention as a curable compound, a cured product having high-level low dielectric properties can be obtained, and dielectric tangent characteristics and resistance to thermal oxidative degradation following a wet heat history can be simultaneously enhanced because of the fact that the copolymer has, within the molecule, a large free volume of molecular size, and has few polar groups.

DESCRIPTION OF EMBODIMENTS

The soluble polyfunctional vinyl aromatic copolymer of the present invention includes structural units derived from a divinyl aromatic compound (a), and structural units derived from styrene (b), and a monovinyl aromatic compound (c) other than styrene.

The copolymer has a number-average molecular weight Mn of 300 to 100,000, and a molecular weight distribution (Mw/Mn) represented by a ratio of the weight-average molecular weight Mw to the number-average molecular weight Mn, of 100 or lower. The copolymer is soluble in toluene, xylene, tetrahydrofuran, dichloroethane or chloroform solvents.

The soluble polyfunctional vinyl aromatic copolymer of the present invention is characterized by having solvent solubility. The structural units in the present description denote terminals and repeating units present in a main chain of the copolymer, and terminal groups or units present in side chains.

The content of structural units derived from the divinyl aromatic compound (a) is 2 mol % or more and less than 95 mol %, with respect to the sum total of the structural units derived from (a), (b), and (c). The structural units derived from the divinyl aromatic compound (a) can be a plurality of structures resulting from reaction of only one the two vinyl groups or resulting from reaction of the two vinyl groups. Preferably, however, the copolymer contains 2 to 80 mol % of structural units represented by Formula (a1) resulting from reaction of only one vinyl group. The content is more preferably 5 to 70 mol %, yet more preferably 10 to 60 mol %, and particularly preferably 15 to 50 mol %. By setting a content of 2 to 80 mol %, a low dielectric tangent, high toughness, excellent heat resistance, and superior compatibility with other resins can be achieved. When the copolymer is used the form of a resin composition, that composition is excellent is excellent in wet heat resistance, resistance to thermal oxidative degradation and molding processability. When the content is lower than 2 mol %, heat resistance tends to drop, while a content in excess of 80 mol % tends to entail poorer interlayer peel strength at the time of lamination.

The content of structural units derived from styrene (b) and a monovinyl aromatic compound (c) other than styrene with respect to the sum total of the structural units derived from (a), (b), and (c) is 5 mol % or more and less than 98 mol %.

The vinyl group that makes up the Formula (a1) and derives from the divinyl aromatic compound (a) acts as a cross-linking component and contributes to bringing out heat resistance in the soluble polyfunctional vinyl aromatic copolymer. Meanwhile, the structural units derived from styrene (b) and a monovinyl aromatic compound (c) other than styrene have no vinyl groups because it is assumed that polymerization progresses ordinarily through 1,2-addition reactions of vinyl groups. That is, the structural units derived from styrene (b) and a monovinyl aromatic compound (c) other than styrene do not act as crosslinking components but contribute to the manifestation of moldability.

Through polymerization, the divinyl aromatic compound (a), styrene (b), and the monovinyl aromatic compound (c) other than styrene form not only structural units including (a1), but also Formulae (t1), (t2), and (t3) as terminal groups. Herein, (t1) is formed by introduction of a terminal group into the soluble polyfunctional vinyl aromatic copolymer as a result of a chain transfer reaction to the monomers (a), (b), and (c). Meanwhile, the terminal group in Formula (t2) is formed as a result of an electrophilic substitution reaction of a carbocation at a growth end with an aromatic ring of one preceding monomer in the growing polymer chain. The terminal group in Formula (t3) is generated through drawing a β-hydrogen off by the carbocation at the growth end. It becomes therefore possible to control characteristics such as heat resistance, curability, and so forth of the soluble polyfunctional vinyl aromatic copolymer, through introduction of such terminal groups. Controlling the generation of Formulae (t1), (t2), and (t3) as terminal groups, i.e. controlling a termination reaction mechanism, is therefore important in the polymerization reaction.

From the above viewpoint, the content of structural units derived from styrene (b) and a monovinyl aromatic compound (c) other than styrene is 5 mol % or more and less than 98 mol % with respect to the sum total of the structural units derived from (a), (b), and (c). This content is preferably 0.90 to 0.30, and yet more preferably 0.85 to 0.25. When the mole fraction of the structural units derived from (b) and (c) is less than 0.05, molding processability is insufficient, whereas when the mole fraction exceeds 0.98, the heat resistance of the cured product is insufficient.

The mole fraction (b1):(c1) of structural units (b1) derived from styrene (b) to structural units (c1) derived from a monovinyl aromatic compound (c) other than styrene is preferably 99:1 to 20:80, since both moldability and resistance to thermal oxidative degradation can be achieved in that case. More preferably, the mole fraction is 98:2 to 30:70. Heat resistance tends to drop in a case where the content of the structural units (b1) derived from styrene (b) is higher than 99:1, and moldability tends to decrease in a case where the content of structural units (c1) derived from a monovinyl aromatic compound (c) other than styrene is higher than 20:80.

The polyfunctional vinyl aromatic copolymer contains terminal groups represented by Formulae (t1), (t2), and (t3) at the terminals of the polyfunctional vinyl aromatic copolymer.

A terminal group of Formula (t1) is formed through chain transfer reaction of the growth end to a monomer, in the production process of the polyfunctional vinyl aromatic copolymer. Herein, the terminal group of Formula (t1) has a structure represented by Formula (t1-1) in a case where the terminal is a structural unit derived from a divinyl aromatic compound (a), and has a structure represented by Formula (t1-2) in a case where the terminal is a structural unit derived from styrene (b) and a monovinyl aromatic compound (c) other than styrene.

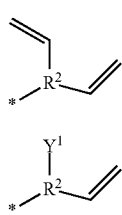

(t1-1)

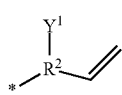

(t1-2)

In the formula, $R^2$ is as defined for Formula (t1), and $Y^1$ represents a hydrogen atom or a C1 to C18 hydrocarbon group.

In the production process of the polyfunctional vinyl aromatic copolymer, the terminal group of Formula (t2) is formed as a result of electrophilic substitution reaction of a carbocation at the growth end with the aromatic ring of one preceding monomer in the growing polymer chain. Herein, the terminal group of Formula (t2) has a structure represented by Formula (t2-1) in a case where both of the two monomer units that form the terminal groups are a structural unit derived from a divinyl aromatic compound (a). The terminal group of Formula (t2) has a structure represented by (t2-2) or (t2-3) in a case where one of the two monomer units that form the terminal groups is a structural unit derived from a divinyl aromatic compound (a), and another one is a structural unit derived from styrene (b) or a monovinyl aromatic compound (c) other than styrene. Or, the terminal group of Formula (t2) has a structure represented by Formula (t2-4) in a case where both of the two monomer units that form the terminal groups are structural units derived from styrene (b) or from a monovinyl aromatic compound (c) other than styrene.

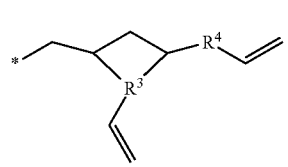

(t2-1)

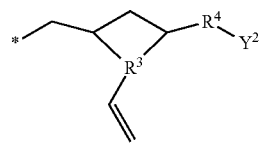

(t2-2)

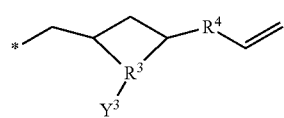

(t2-3)

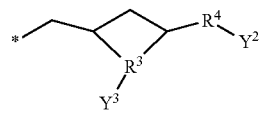

(t2-4)

In the formulae, $R^3$ and $R^4$ are as defined for Formula (t2), and $Y^2$ and $Y^3$ independently represent a hydrogen atom or a C1 to C18 hydrocarbon group.

In the production process of the polyfunctional vinyl aromatic copolymer, terminal group of Formula (t3) is formed through a β-hydrogen elimination reaction where the growth end abstracts a β-hydrogen. Herein, the terminal group of Formula (t3) has a structure represented by Formula (t3-1) in a case where the terminal is a structural unit derived from a divinyl aromatic compound (a), and has a structure represented by (t3-2) in a case where the end is a structural unit derived from styrene (b) and a monovinyl aromatic compound (c) other than styrene.

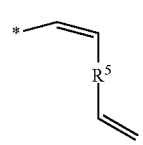

(t3-1)

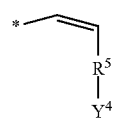

(t3-2)

In the formula, $R^5$ is as defined for Formula (t3), and $Y^4$ represents a hydrogen atom or a C1 to C18 hydrocarbon group.

The mole fraction of (a1), (t1), (t2), and (t3) in the copolymer with respect to the sum total of the divinyl aromatic compound (a), styrene (b), and monovinyl aromatic compound (c) other than styrene lies in the range of 0.02 to 0.8. This denotes the contents of the vinyl groups and terminal groups in the soluble polyfunctional vinyl aromatic copolymer. When the mole fraction is lower than 0.02, heat resistance drops, whereas when the mole fraction is higher than 0.8, there decreases interlayer peel strength when the copolymer is made into a laminate. The molar ratio is preferably 0.05 to 0.8, more preferably 0.10 to 0.70, and particularly preferably 0.15 to 0.65. Preferred mole fractions are the same also in a case where the copolymer includes structural units derived from a monomer other than (a), (b), and (c) above.

Preferably, the mole fraction of the structural units of Formula (a1) and the terminal groups of Formulae (t1-1), (t1-2), (t2-1), (t2-2), (t2-3), (t3-1), and (t3-2), i.e. the mole fraction of vinyl groups in in the main chain and in the terminal groups, with respect to the sum total of the divinyl aromatic compound (a), styrene (b), and monovinyl aromatic compound (c) other than styrene, lies in the range of 0.05 to 0.8, since both heat resistance and interlayer peel strength are concurrently achieved in that case. The mole fraction is more preferably 0.10 to 0.70, and particularly preferably 0.15 to 0.65.

The introduction amount in the copolymer of a terminal group (tv) having a vinyl group is 0.2 or more per molecule. The terminal group (tv) having a vinyl group denotes herein all of (t1) above, terminal groups among (t2) where $Z^3$ and/or $Z^4$ are a vinyl group, and terminal groups among (t3) where $Z^5$ is a vinyl group. The introduction amount of a terminal group (tv) having a vinyl group refers to the total of Formulae (t1-1), (t1-2), (t2-1), (t2-2), (t2-3), (t3-1), and (t3-2). Curability and heat resistance decrease in a case where the introduction amount of a terminal group (tv) having a vinyl group is smaller than 0.2 groups. Preferably, the introduction amount of is 0.5 or more groups, and more preferably 0.6 or more groups, per molecule.

The mole fraction of Formula (t3) in the copolymer with respect to the sum total of structural units of Formulae (t1), (t2), and (t3) is 0.7 or lower. The terminal groups represented by Formula (t3), i.e. the (t3-1) and (t3-2) terminal groups, are terminal groups having a vinylene bond. When the mole fraction of the terminal group of Formula (t3) is higher than 0.7, resistance to thermal oxidative degradation and wet heat resistance decrease. Preferably, the mole fraction is 0.6 or lower, and particularly preferably is 0.5 or lower. The mole fraction of Formula (t3) with respect to the sum total of structural units of Formulae (a1), (t1), (t2), and (t3) in the copolymer is preferably 0.3 or lower, and more preferably 0.2 or lower.

The number-average molecular weight of the soluble polyfunctional vinyl aromatic copolymer (Mn: number-average molecular weight on a standard polystyrene basis, as measured by gel permeation chromatography) is preferably 300 to 100,000, more preferably 400 to 50,000 and yet more preferably 500 to 10,000. The heat resistance of the cured product tends to decrease because of an increase in the content of monofunctional copolymer components included in the soluble polyfunctional vinyl aromatic copolymer, when Mn is lower than 300. When Mn exceeds 100,000, gelling is prone to occur, and molding processability tends to worsen owing to the increased viscosity.

A value of the molecular weight distribution (Mw/Mn) represented by a ratio of the weight-average molecular weight (Mw: weight-average molecular weight on a standard polystyrene basis as measured by gel permeation chromatography) and Mn is 100.0 or lower, preferably 50.0 or lower, more preferably 1.5 to 30.0, and most preferably 2.0 to 20.0. The processing characteristics of the soluble polyfunctional vinyl aromatic copolymer tend to worsen, and gelling to occur, when Mw/Mn exceeds 100.0.

The soluble polyfunctional vinyl aromatic copolymer is soluble in toluene, xylene, tetrahydrofuran, dichloroethane or chloroform, as solvents, but is preferably soluble in all of the foregoing solvents. Given that the copolymer is polyfunctional and soluble in solvents, the copolymer is required to exhibit a moderate degree of cross-linking in that some of the vinyl groups of divinylbenzene remain without being crosslinked. The term soluble in solvents signifies that 5 g or more of the soluble polyfunctional vinyl aromatic copolymer, more preferably 30 g or more, and particularly preferably 50 g or more, dissolves in 100 g of the solvent.

A method for producing a soluble polyfunctional vinyl aromatic copolymer of the present invention will be explained next. This production method allows producing the above polyfunctional vinyl aromatic copolymer advantageously.

The method for producing a soluble polyfunctional vinyl aromatic copolymer of the present invention is a method for producing a polyfunctional vinyl aromatic copolymer through polymerization of a divinyl aromatic compound (a), styrene (b), and a monovinyl aromatic compound (c) other than styrene, in the presence of a Lewis acid catalyst (f) and a Lewis base compound (g), wherein the divinyl aromatic compound (a) is used in an amount of 2 mol % or more and less than 95 mol %, and styrene (b) and the monovinyl aromatic compound (c) other than styrene are used in an amount of 5 mol % or more and less than 98 mol %, with respect to the sum total of (a), (b), and (c), at a temperature in the range of −20° C. to 120° C.

The Lewis acid catalyst (f) acts as a catalyst and the Lewis base compound (g) acts as a co-catalyst.

The divinyl aromatic compound (a) plays the role of eliciting polyfunctionality through formation of a branched structure and plays a role as a crosslinking component for bringing about heat resistance, during thermal curing of the obtained soluble polyfunctional vinyl aromatic copolymer.

Examples of the divinyl aromatic compound (a) are not particularly limited, so long as the compound is aromatic and has two vinyl groups, but divinylbenzene (including regioisomers and mixtures thereof), divinylnaphthalene (including regioisomers and mixtures thereof), and divinyl biphenyl (including regioisomers and mixtures thereof) are preferably used herein. The foregoing can be used singly or as a combination of two or more types. More preferably, the divinyl aromatic compound (a) is divinylbenzene (m-isomer, p-isomer, or a regioisomer mixture of the foregoing), from the viewpoint of molding processability.

The monovinyl aromatic compound is styrene (b) and a monovinyl aromatic compound (c) other than styrene. Styrene (b) is essential as the monovinyl aromatic compound, while also the monovinyl aromatic compound (c) other than styrene must be used concomitantly.

As a monomer component, styrene (b) plays the role of imparting low dielectric properties and resistance to thermal oxidative degradation to the soluble polyfunctional vinyl aromatic copolymer, and as a chain transfer agent, plays the role of controlling the molecular weight of the soluble polyfunctional vinyl aromatic copolymer, and introducing vinyl groups to terminals of the soluble polyfunctional vinyl aromatic copolymer.

The monovinyl aromatic compound (c) other than styrene enhances the solvent solubility and processability of the soluble polyfunctional vinyl aromatic copolymer.

Examples of the monovinyl aromatic compound (c) other than styrene are not particularly limited, so long as the compound is aromatic and has a vinyl group and is not styrene. Examples include vinyl aromatic compounds such as vinylnaphthalene and vinyl biphenyl; and nucleus alkyl-substituted vinyl aromatic compounds such as o-methylstyrene, m-methylstyrene, p-methylstyrene, o,p-dimethylstyrene, o-ethylvinylbenzene, m-ethylvinylbenzene and p-ethylvinylbenzene. Preferred herein are ethylvinylbenzene (including regioisomers and mixtures thereof), ethylvinylbiphenyl (including regioisomers and mixtures thereof) and ethylvinylnaphthalene (including regioisomers and mixtures thereof), since the foregoing prevent gelling of the soluble polyfunctional vinyl aromatic copolymer, elicit the effect of enhancing solvent solubility and processability, and are inexpensive and readily available. More preferably, the monovinyl aromatic compound (c) other than styrene is ethylvinylbenzene (m-isomer, p-isomer, or mixture of these regioisomers), from the viewpoint of dielectric properties and cost.

Besides the divinyl aromatic compound (a), styrene (b), and monovinyl aromatic compound (c) other than styrene, another monomer component (d) such as a trivinyl aromatic compound, a trivinyl aliphatic compound, a divinyl aliphatic compound or a monovinyl aliphatic compound can be used, and structural units derived from the other monomer component (d) may be introduced into the soluble polyfunctional vinyl aromatic copolymer, so long as the effect of the present invention is not impaired thereby.

Examples of the other monomer component (d) include 1,3,5-trivinylbenzene, 1,3,5-trivinylnaphthalene, 1,2,4-trivinylcyclohexane, ethylene glycol diacrylate, butadiene, 1,4-butanediol divinyl ether, cyclohexane dimethanol divinyl ether, diethylene glycol divinyl ether, and triallyl isocyanurate. The foregoing can be used singly or as a combination of two or more types.

Preferably, the mole fraction of the other monomer component (d) with respect to the sum total of all monomer components (a), (b), (c), and (d) is lower than 30 mol %. Preferably, the mole fraction of the structural units derived from the other monomer component (d) with respect to all monomer components (a), (b) (c), and (d) that make up the copolymer is lower than 30 mol %.

As the other monomer, a vinylic compound (e) containing a hydroxy group, for instance hydroxyethyl (meth)acrylate or hydroxypropyl (meth)acrylate, can be used as needed, to introduce structural units derived from (e) into the soluble polyfunctional vinyl aromatic copolymer.

The mole fraction of the vinylic compound (e) containing a hydroxy group with respect to the sum total of all monomer components (a), (b), (c), (d), and (e) is preferably lower than 10 mol %, more preferably lower than 5 mol %. Preferably, the structural units (e) derived from the vinylic compound (e) containing a hydroxy group with respect to the sum total of the structural units in the soluble polyfunctional vinyl aromatic copolymer is lower than 10 mol %.

The proportions of use of the essential monomer components (a), (b), and (c) are 2 mol % or more and less than 95 mol % for the divinyl aromatic compound (a), and 5 mol % or more and less than 98 mol %, collectively, for the monovinyl aromatic compounds (b) and (c), with respect to the sum total of (a), (b), and (c); these monomer components (a), (b), and (c) are then polymerized at a temperature of −20° C. to 120° C.

The blending amount of the divinyl aromatic compound (a) is preferably 5 to 80 mol %, more preferably 7 to 70 mol %, and yet more preferably 10 to 60 mol %.

The blending amount of the total of the monovinyl aromatic compounds (b) and (c) is preferably 95 to 20 mol %, more preferably 93 to 30 mol %, and particularly preferably 90 to 40 mol %.

Ordinarily, styrene (b) has poorer reactivity than the divinyl aromatic compound (a) and the monovinyl aromatic compound (c) other than styrene, and in particular than the other monomer component such as a nucleus alkyl-substituted vinyl aromatic compound. Accordingly, it is preferable to use an excess of styrene (b) so that part thereof remains unreacted. The residual unreacted styrene (b) is then removed in a process of purifying the soluble polyfunctional vinyl aromatic copolymer. The use proportion of styrene (b) lies preferably in the range of 95 to 20 mol %, more preferably 90 to 30 mol % and yet more preferably 80 to 35 mol %, with respect to the sum total of the monomer components (a), (b), and (c).

Preferably, the monomer components are used so that terminal groups derived from the monovinyl aromatic compound (b) or (c), i.e. (t1-2), (t2-2), (t2-3), or (t3-2) constitute 10 mol % or more with respect to the sum total of all terminal groups of the soluble polyfunctional vinyl aromatic copolymer. Within such ranges the amount of vinyl groups introduced into the terminals of the soluble polyfunctional vinyl aromatic copolymer is appropriate, and it becomes possible to concurrently achieve low dielectric properties, resistance to thermal oxidative degradation, solvent solubility, and processability. More preferably, the above value is 20 mol % or higher, yet more preferably 30 mol % or higher, and particularly preferably 40 mol % or higher.

The Lewis acid catalyst (f) is a compound made up of a metal ion (acid) and a ligand (base group), and any such compound can be used herein so long as the compound accepts electron pairs. Preferred examples among the foregoing include metal fluorides and complexes thereof, in particular divalent to hexavalent metal fluorides of B, Al, Ga, In, Si, Ge, Sn, Pb, Sb, Bi, Ti, W, Zn, Fe, and V, and complexes thereof, from the viewpoint of resistance to thermal decomposition of the obtained soluble polyfunctional vinyl aromatic copolymer. The foregoing catalysts can be used singly or as a combination of two or more types. An ether complex of boron trifluoride is most preferably used herein from the viewpoint of control of the molecular weight and of the molecular weight distribution of the soluble polyfunctional vinyl aromatic copolymer that is obtained, and in terms of polymerization activity. Ethers of ether complexes include herein for instance diethyl ether and dimethyl ether.

The content of the Lewis acid catalyst (f) may lie in the range of 0.001 to 100 moles, and is more preferably 0.01 to 50 moles, with respect to 100 moles as the total of all monomer components. More preferably, the above content is 0.1 to 20 moles. Control of the molecular weight distribution is difficult when the content exceeds 100 moles, since in that case the polymerization rate is excessively high. By contrast, a content of less than 0.001 moles entails higher costs and is not suitable for industrial implementation because of the excessively low polymerization rate involved.

In the method for producing a soluble polyfunctional vinyl aromatic copolymer of the present invention one or more types of Lewis base compound (g) are used as a co-catalyst. Concrete examples of the Lewis base compound (g) include the following compounds:

1) ester compounds such as ethyl acetate, propyl acetate, butyl acetate, phenyl acetate, and methyl propionate;

2) thioester compounds such as methyl mercaptopropionate and ethyl mercaptopropionate;

3) ketone compounds such as ethyl methyl ketone, isobutyl methyl ketone, and benzophenone;

4) amine compounds as methylamine, ethylamine, propylamine, butylamine, cyclohexylamine, ethylmethylamine, dimethylamine, diethylamine, dipropylamine, and dibutylamine;

5) ether compounds such as diethyl ether and tetrahydrofuran;

6) thioether compound such as diethyl sulfide and diphenyl sulfide; and 7) phosphine compounds such as tripropyl phosphine, tributyl phosphine, trihexyl phosphine, tricyclohexyl phosphine, trioctyl phosphine, vinyl phosphine, propenyl phosphine, cyclohexenyl phosphine, dialkenyl phosphines, and trialkenyl phosphines.

Preferred among the foregoing are at least one compound selected from the group consisting of ester compounds, ketone compounds, and ether, compounds, more preferably ester, compounds, and ketone, compounds, from the viewpoint of making it possible to easily control the polymerization rate and the molecular weight distribution of the polymer, by acting synergistically with the Lewis acid catalyst (f). Herein, one, two or more types of the Lewis base compound (g) can be used.

By becoming coordinated to the Lewis acid catalyst (f) as a counter anion, the Lewis base compound (g) controls the interaction between the counter anion and a carbocation as the active species, thereby regulating a relative reaction frequency between the monomers (a), (b), and (c) functioning also as chain transfer agents. Ordinarily interactions between a counter anion and a carbocation as an active species are reinforced through addition of the Lewis base compound (g). As a result, the Lewis base compound (g) curtails excessive occurrence of insertion reactions by the monomers (a), (b), and (c), and facilitates chain transfer reactions after the insertion reactions of the monomers (a), (b), and (c), and makes thus molecular weight easier to control.

The Lewis base compound (g) is preferably 0.1 to 1000 moles, more preferably 1.0 to 500 moles, and particularly preferably 10 to 200 moles, with respect to 100 moles as the total of all monomer components. Within such ranges, the polymerization rate is properly kept, and at the same time, reaction selectivity between monomers is enhanced, whereby a soluble polyfunctional vinyl aromatic copolymer is obtained that boasts superior molding processability and is excellent in productivity, and in which excessive increases and decreases in molecular weight are curtailed.

In the polymerization reaction, a copolymer is obtained through cationic copolymerization, at a temperature of 20° C. to 120° C., of a polymerization starting material that contains a mixture of the above monomers, the Lewis acid catalyst (f) and the Lewis base compound (g).

A solvent can be added as desired. Examples of the solvent which can be used include an organic solvent which is a compound having a permittivity in the range of 2 to 15, and which essentially does not hinder cationic polymerization, and which forms a homogeneous solution by dissolving the Lewis acid catalyst (f), the Lewis base compound (g), the monomer components, and the soluble polyfunctional vinyl aromatic copolymer that is generated. Such a solvent may be used singly or in combinations of two or more types. A solvent permittivity smaller than 2 is undesirable, since this translates into a broader molecular weight distribution, while a permittivity in excess of 15 entails a drop-in polymerization rate.

Preferred examples of the organic solvent include particularly preferably toluene, xylene, n-hexane, cyclohexane, methyl cyclohexane, and ethyl cyclohexane, from the viewpoint of striking a balance between polymerization activity and solubility. The amount of the solvent is set taking into consideration for instance the viscosity of the obtained polymerization solution, and ease of heat removal, so that when polymerization is terminated, the concentration of copolymer in the polymerization solution is 1 to 90 wt %, preferably 10 to 80 wt %, and particularly preferably 20 to 70 wt %. A concentration lower than 1 wt % translates into low polymerization efficiency and higher costs, whereas a concentration in excess of 90 wt % entails a higher molecular weight of the generated soluble polyfunctional vinyl aromatic copolymer, a wider molecular weight distribution, and poorer molding processability.

To produce the soluble polyfunctional vinyl aromatic copolymer, the monomers (a), (b), and (c) are required to be polymerized at a temperature from −20° C. to 120° C. Preferably, the temperature is 0° C. to 110° C. Particularly preferably, the temperature is 30° C. to 90° C. When the polymerization temperature exceeds 120° C., reaction selectivity drops, and accordingly the resulting greater molecular weight distribution and the occurrence of gelling become problematic; when conducting polymerization at below −20° C., catalytic activity drops significantly, and it becomes necessary to add a large amount of catalyst.

The method for recovering the soluble polyfunctional vinyl aromatic copolymer after the polymerization reaction is terminated is not particularly limited, and may be a method ordinarily resorted to, for instance heating concentration, steam stripping, or precipitation in a poor solvent.

The soluble polyfunctional vinyl aromatic copolymer obtained in accordance with the above production method contains 2 mol % or more and less than 95 mol % of structural units derived from a divinyl aromatic compound (a), contains 5 mol % or more and less than 98 mol % of structural units derived from styrene (b) and a monovinyl aromatic compound (c) other than styrene; contains structural units having the unsaturated hydrocarbon group represented by Formula (a1); and contains, at terminals, terminal groups represented by Formulae (t1), (t2), and (t3). Further, the soluble polyfunctional vinyl aromatic copolymer satisfies Formulae (1) to (3), has Mn of 300 to 100,000, Mw/Mn of 100 or lower and is soluble in toluene, xylene, tetrahydrofuran, dichloroethane, or chloroform.

A curable resin composition of the present invention will be explained next.

The curable resin composition of the present invention contains the soluble polyfunctional vinyl aromatic copolymer of the present invention (including a soluble polyfunctional vinyl aromatic copolymer in accordance with the production method of the present invention), and a radical polymerization initiator (h) (also referred to as radical polymerization catalyst). The radical polymerization initiator is incorporated for instance for the purpose of lowering the temperature and promoting crosslinking reactions of unsaturated groups during curing of the curable resin composition of the present invention when crosslinking reactions are elicited by some means such as heating, as described below.

Known substances are used as the radical polymerization initiator (h). Representative examples include, although not limited thereto, peroxides such as benzoyl peroxide, cumene hydroperoxide, 2,5-dimethylhexane-2,5-dihydroperoxide, 2,5-dimethyl-2,5-di(t-butylperoxy)hexyne-3, di-t-butyl peroxide, t-butylcumyl peroxide, α,α'-bis(t-butylperoxy-m-isopropyl)benzene, 2,5-dimethyl-2,5-di(t-butylperoxy)hexane, dicumyl peroxide, di-t-butylperoxyisophthalate, t-butylperoxybenzoate, 2,2-bis(t-butylperoxy)butane, 2,2-bis(t-butylperoxy)octane, 2,5-dimethyl-2,5-di(benzoylperoxy)hexane, di(trimethylsilyl) peroxide, and trimethylsilyltriphenylsilyl peroxide. Although not a peroxide, also 2,3-dimethyl-2,3-diphenylbutane can be used as the radical polymerization initiator (h). The polymerization initiator is however not limited to these examples. Herein, α,α'-bis(t-butyl peroxy-m-isopropyl)benzene is preferably used among the foregoing. The reaction start temperature of α,α'-bis(t-butyl peroxy-m-isopropyl)benzene is comparatively high. As a result, it becomes possible to suppress promotion of curing reactions at times where curing is not necessary, for instance during prepreg drying, and to curtail drops in storability of the curable resin composition of the present invention. Moreover, α,α'-bis(t-butyl peroxy-m-isopropyl)benzene has low volatility, and accordingly boasts good stability in terms of not volatilizing during drying or storage of prepreg. The radical polymerization initiator (h) may be used singly or in combinations of two or more types.

The blending amount of the radical polymerization initiator (h) lies preferably in the range of 0.01 to 10 parts by weight, more preferably 0.1 to 8 parts by weight with respect to 100 parts by weight of the soluble polyfunctional vinyl aromatic copolymer. Within such ranges, curing reactions progress suitably without hindrance to the reactions.

A known curable reactive resin (i) or thermoplastic resin (j) may be included in the curable resin composition. Besides thermosetting resins, examples of the curable reactive resin (i) include resins or compounds that yield a cured resin through copolymerization with the soluble polyfunctional vinyl aromatic copolymer. Examples include for instance vinyl ester resins, polyvinylbenzyl resins, unsaturated polyester resins, curable vinyl resins, curable polyphenylene ether-based resins, maleimide resins, epoxy resins, polycyanate resins, phenolic resins, and one or more types of vinyl compound having one or more polymerizable unsaturated hydrocarbon groups in the molecule.

Examples of the thermoplastic resin (j) include for instance polystyrene, polyphenylene ether resins, polyether imide resins, polyether sulfone resins, PPS resins, polycyclopentadiene resins and polycycloolefin resins, as well as known thermoplastic elastomers, for instance styrene-ethylene-propylene copolymers, styrene-ethylene-butylene copolymers, styrene-butadiene copolymers, styrene-isoprene copolymers, hydrogenated styrene-butadiene copolymers, hydrogenated styrene-isoprene copolymers; or rubbers such as polybutadiene and polyisoprene.

Examples of the curable reactive resin (i) include preferably polyvinylbenzyl resins, curable vinyl resins, curable polyphenylene ether-based resins, epoxy resins, and one or more types of vinyl compound having one or more polymerizable unsaturated hydrocarbon groups in the molecule, from the viewpoint of dielectric properties, heat resistance and adhesion as a curable resin composition, and compatibility with the polyfunctional vinyl aromatic copolymer. Examples of thermoplastic resins include polystyrene, polyphenylene ether resins, styrene-ethylene-propylene copolymers, styrene-ethylene-butylene copolymers, styrene-butadiene copolymers, styrene-isoprene copolymers, hydrogenated styrene-butadiene copolymers, and hydrogenated styrene-isoprene copolymers. More preferred examples of the curable reactive resin include polyvinylbenzyl resins, curable polyphenylene ether-based resins, epoxy resins, and one or more types of vinyl compound having one or more polymerizable unsaturated hydrocarbon groups in the molecule. More preferred examples of the thermoplastic resin (j) include polyphenylene ether resins and hydrogenated styrene-butadiene copolymers.

Yet more preferred examples of the curable reactive resin (i) include curable polyphenylene ether-based resins, epoxy resins, and one or more types of a vinyl compound (id) having one or more polymerizable unsaturated hydrocarbon groups in the molecule.

In a case where the curable reactive resin (i) is a curable polyphenylene ether-based resin, the curable reactive resin (i) is more preferably a modified polyphenylene ether compound (ia) having a curable terminal functional group. Yet more preferably, the curable reactive resin (i) is a modified polyphenylene ether compound containing an unsaturated hydrocarbon group. The curable reactive resin (i) is a modified polyphenylene ether compound (ia) being terminally modified with a substituent having a carbon-carbon unsaturated double bond. Most preferably, the curable reactive resin (i) is a modified polyphenylene ether compound having a curable terminal functional group such that the above substituent having a carbon-carbon unsaturated double bond is herein a substituent selected from the group consisting of vinylbenzyl groups, vinyl groups, acrylate groups and methacrylate groups.

The average number (number of terminal functional groups) of unsaturated hydrocarbon groups in one molecule of the modified polyphenylene ether compound containing an unsaturated hydrocarbon group at a terminal is not particularly limited. Preferably, the above average number is 1 to 5, more preferably 1 to 3, and yet more preferably 1.5 to 3, from the viewpoint of heat resistance of the cured product and from the viewpoint of striking a balance between storage stability and flowability of the curable resin composition.

The Mn of the curable polyphenylene ether-based resin is not particularly limited, but is preferably 500 to 7000, more preferably 800 to 5000, and most preferably 1000 to 3000. Herein, Mn may be measured in accordance with a general molecular weight measurement method, and specifically may be a value measured by gel permeation chromatography (GPC).

The toughness and moldability of the cured product of the obtained curable resin composition become higher when the Mn of the curable polyphenylene ether-based resin lies within such ranges. That is because flowability is improved, while toughness is maintained, when the number-average molecular weight of the curable polyphenylene ether-based resin lies within such a range, since the molecular weight is herein comparatively low. In ordinary polyphenylene ethers, the heat resistance and toughness of the cured product tends to drop in a case where a polyphenylene ether of such low molecular weight is used. The above curable polyphenylene ether-based resin, however, has polymerizable unsaturated double bonds at a terminal. Therefore, through copolymerization or curing together with a vinyl-based curable resin, such as the copolymer of the present invention, cross-linking of the resin and the copolymer proceeds suitably, and a cured product is obtained that sufficiently combines high heat resistance and toughness. The obtained cured product of the curable resin composition boasts superior heat resistance and excellent toughness.

In a case where the curable reactive resin (i) is an epoxy resin, preferably the epoxy resin is one or more types of epoxy resin (ib) selected from the group consisting of epoxy resins having two or more epoxy groups in the molecule. Examples of (ib) include cresol novolac-type epoxy resins, triphenyl methane-type epoxy resins, biphenyl epoxy resins, naphthalene-type epoxy resins, bisphenol A epoxy resins, and bisphenol F epoxy resins. The foregoing can be used singly or in combinations of two or more types. The curable resin composition of the present invention preferably does not contain a halogenated epoxy resin, but may contain one, as needed, so long as the effect of the present invention is not impaired thereby.

It is deemed that through the use of such an epoxy resin the heat resistance and adhesion of the cured product are sufficiently increased, without detracting from the superior dielectric properties and flowability of the soluble polyfunctional vinyl aromatic copolymer.

The curable reactive resin (i) is not particularly limited, in a case where it is one or more types of vinyl compound (id) having one or more polymerizable unsaturated hydrocarbon groups in the molecule. That is, (id) may be a curable reactive resin that allows for the formation of cross-links and that can be cured through reaction with the polyfunctional vinyl aromatic copolymer of the present invention. More preferably, the polymerizable unsaturated hydrocarbon group is a carbon-carbon unsaturated double bond. Yet more preferred herein is a compound having two or more carbon-carbon unsaturated double bonds in the molecule.

The vinyl compound (id) as a curable reactive resin has preferably a weight-average molecular weight (Mw) of 100 to 5,000, more preferably of 100 to 4,000, and yet more preferably of 100 to 3,000. When Mw is lower than 100, (id) might volatilize readily from the formulation component system of the curable resin composition. When Mw exceeds 5,000, the viscosity of a varnish of the curable resin composition, and melt viscosity at the time of heating molding, may become excessively high. Accordingly, a curable resin composition such that the cured product boasts excellent heat resistance is obtained when the Mw of (id) lies within such ranges. It is deemed that the underlying reason for this is that cross-links can be formed suitably as a result of a reaction between the soluble polyfunctional vinyl aromatic copolymer and (id). Herein, Mw may be measured in accordance with a general molecular weight measurement method, and specifically may be a value measured by gel permeation chromatography (GPC).

The average number of carbon-carbon unsaturated double bonds (number of terminal double bonds) per molecule of the vinyl compound (id) as a curable reactive resin varies depending on the Mw of (id), but is for instance preferably 1 to 20, more preferably 2 to 18. A trend is observed whereby when the number of terminal double bonds is excessively small, a product that affords sufficient cured product heat resistance is obtained less readily. When the number of terminal double bonds is excessive, reactivity becomes too high, and problems may arise in that for instance the storability of the curable resin composition drops and also the flowability of the curable resin composition decreases.

The vinyl compound (id) as a curable reactive resin may be a trialkenyl isocyanurate compound such as triallyl isocyanurate (TRIC); a polyfunctional methacrylate compound having two or more methacrylic groups in the molecule; a polyfunctional acrylate compound having two or more acrylic groups in the molecule; a vinyl compound (polyfunctional vinyl compound) having two or more vinyl groups in the molecule, such as polybutadiene; or a vinylbenzyl compound such as styrene and divinylbenzene, having a vinylbenzyl group in the molecule. Preferred among the foregoing is a vinyl compound (id) having two or more carbon-carbon double bonds in the molecule. Concrete examples include trialkenyl isocyanurate compounds, polyfunctional acrylate compounds, polyfunctional methacrylate compounds, polyfunctional vinyl compounds and divinylbenzene compounds. It is deemed that when these are used, cross-links become formed yet more readily as a result of the curing reaction, and the heat resistance of the cured product of the curable resin composition is further enhanced. The foregoing can be used singly or in combinations of two or more types. A compound having one carbon-carbon unsaturated double bond in the molecule may be used concomitantly herein. Examples of compounds having one carbon-carbon unsaturated double bond in the molecule include compounds (monovinyl compounds) having one vinyl group in the molecule.

The content of the soluble polyfunctional vinyl aromatic copolymer is preferably 30 to 90 parts by mass, and more preferably 50 to 90 parts by mass, with respect to 100 parts by mass of the total of the soluble polyfunctional vinyl aromatic copolymer and the vinyl compound (id) as the curable reactive resin. The content of the vinyl compound (id) as the curable reactive resin is preferably 10 to 70 parts by mass, more preferably 10 to 50 parts by mass, with respect to 100 parts by mass as the total of the soluble polyfunctional vinyl aromatic copolymer plus (id). That is, the content ratio of the soluble polyfunctional vinyl aromatic copolymer and the vinyl compound (id) as the curable reactive resin is preferably 90:10 to 30:70, more preferably 90:10 to 50:50, in mass ratio. A curable resin composition that boasts yet better heat resistance of the cured product and superior flame retardance is obtained with contents that satisfy the above ratio. This is ostensibly because the curing reaction between the soluble polyfunctional vinyl aromatic copolymer and the vinyl compound (id) as the curable reactive resin can proceed suitably in that case.

A known flame retardant (k) can be formulated into the curable resin composition of the present invention. The flame retardant (k) allows further increasing the flame retardance of the cured product of the curable resin composition. The flame retardant (k) is not particularly limited. In the fields where halogen-based flame retardants are used, for instance bromine-based flame retardants, such flame retardants are preferably ethylenedipentabromobenzene, ethylenebistetrabromoimide, decabromodiphenyl oxide or tetradecabromodiphenoxybenzene, which each have a melting point of 300° C. or higher. It is deemed that using herein halogen-based flame retardant allows suppressing release of a halogen when at high temperature, and curtailing loss of heat resistance. In fields where halogen-free flame retardants are required, such flame retardants include phosphate ester-based, phosphazene-based and phosphinic acid-based flame retardants. Concrete examples of phosphate ester-based flame retardants include condensed phosphate esters of dixylenyl phosphate. Specific examples of phosphazene-based flame retardants include phenoxyphosphazene. Concrete examples of phosphinic acid salt-based flame retardants include phosphinate metal salts such as aluminum dialkyl phosphinates. The various flame retardants exemplified above can be used singly or in combinations of two or more types.

A known filler (l) can be formulated into the curable resin composition of the present invention. The filler (l) is not particularly limited and includes for instance fillers that are added in order to enhance the heat resistance and flame retardance of the cured product of the curable resin composition. The heat resistance, flame retardance and so forth can be further increased through incorporation of the filler (l). Specific examples include metal oxides such as silica, for instance spherical silica, alumina, titanium oxide and mica, metal hydroxides such as aluminum hydroxide and magnesium hydroxide, as well as talc, aluminum borate, barium sulfate and calcium carbonate. Preferred among the foregoing are silica, mica and talc, and more preferably spherical silica. The foregoing can be used singly or in combinations of two or more types. The filler may be used as-is, or having been surface-treated with a silane coupling agent, for instance of epoxysilane type or aminosilane type. Preferred silane coupling agents include vinylsilane types, methacryloxysilane types, acryloxysilane types and styrylsilane types, from the viewpoint of reactivity with the radical polymerization initiator (h). As a result, adhesive strength with a metal foil and interlayer average strength between resins are increased. The silane coupling agent may be added to the filler (1) in accordance with an integral blending method, instead of a method in which the filler (1) is surface-treated beforehand.

The content of the filler (l) is preferably 10 to 200 parts by mass, and more preferably 30 to 150 parts by mass, with respect to 100 parts by mass as the total of the organic components such as monomers and so forth and the flame retardant (k).

The curable resin composition of the present invention may further contain additives other than the flame retardant (k) and the filler (1). Examples of such additives include defoaming agents such as silicone-based defoaming agents and acrylate ester-based defoaming agents, heat stabilizers, antistatic agents, ultraviolet absorbers, dyes and pigments, lubricants, and dispersants such as wetting dispersants.

To produce a prepreg, the curable resin composition of the present invention can be made into a resin varnish by being prepared into varnish form, for the purpose of impregnating a base material (fibrous base material) for forming the prepreg, in order to constitute a circuit board material for forming a circuit board.

The resin varnish contains the soluble polyfunctional vinyl aromatic copolymer, the radical polymerization initiator (h), and a solvent. As desired, the resin varnish may further contain the curable reactive resin (i), the thermoplastic resin (j), the flame retardant (k), the filler (l), and other additives. The resin varnish can be used as a varnish for circuit board materials, suitable for circuit boards. The use of the circuit board materials includes specifically for instance printed wiring boards, printed circuit boards, flexible printed wiring boards and build-up wiring boards.

The resin varnish is for instance prepared as follows.

Firstly, the components that can dissolve in an organic solvent, such as soluble polyfunctional vinyl aromatic copolymer, the curable reactive resin (i), and so forth, are charged into and dissolved in the organic solvent. This may be accomplished with heating, as needed. Components such as the inorganic filler and so forth that are not dissolved in the organic solvent are added thereafter, with dispersion using for instance a ball mill, a bead mill, a planetary mixer, or a roll mill, to prepare a varnish-like curable resin composition. The organic solvent that is used herein is not particularly limited, so long as it can dissolve the soluble polyfunctional vinyl aromatic copolymer, (i) and so forth, and does not hinder curing reactions. Examples include for instance ketones such as acetone, methyl ethyl ketone and methyl isobutyl ketone; esters such as ethyl acetate, propyl acetate and butyl acetate; polar solvent such as dimethylacetamide and dimethylformamide; and aromatic hydrocarbon solvents such as toluene and xylene. The foregoing can be used singly or in mixtures of two or more types. Preferred herein are aromatic hydrocarbons such as benzene, toluene, or xylene, from the viewpoint of dielectric properties.

The amount of organic solvent that is used for preparing the resin varnish is preferably 5 to 900 wt %, more preferably 10 to 700 wt %, and particularly preferably 20 to 500 wt %, with respect to 100 wt % as the curable resin composition of the present invention. In a case where the curable resin composition of the present invention is an organic solvent solution such as a resin varnish the amount of organic solvent is not factored in the calculation of the composition.

The cured product obtained through curing of the curable resin composition of the present invention can be used as a molded product, a laminate, a cast product, an adhesive, a coating, or a film. For instance, cured products of semiconductor encapsulating materials are cast products or molded products. Methods for obtaining a cured product for such applications may involve casting a curable resin composition or molding the curable resin composition using for instance a transfer molding machine, or an injection molding machine, whereupon the cured product can be obtained through further heating at 80° C. to 230° C. for 0.5 to 10 hours. Cured products of varnishes for circuit boards are laminates. Methods for obtaining such a cured product may involve impregnating a base material such as glass fibers, carbon fibers, polyester fibers, polyamide fibers, alumina fibers or paper, with the varnish for circuit boards, followed by heating and drying, to yield a prepreg. Then prepreg sheets are laid up on each other, with or without a metal foil, for instance a copper foil, and the resulting stack is heat press-molded.

An inorganic high-dielectric powder such as barium titanate or an inorganic magnetic body such as ferrite is blended into the curable resin composition or resin varnish, to thereby render the resin composition or varnish yet better as a material for electronic components, in particular as a material for high-frequency electronic components.

The curable resin composition of the present invention can be used by being affixed to a metal foil (the meaning of which includes also metal sheets; the same applies hereafter), similarly to the cured composite material described below.

An explanation follows next on a curable composite material, and a cured body thereof, of the curable resin composition of the present invention. A base material is added to the curable composite material by the curable resin composition of the present invention, for the purpose of increasing mechanical strength and dimensional stability.

Known materials can be used as such a base material. Examples thereof include for instance various types of cloth and paper, for example, glass cloth such as roving cloth, cloth, chopped mats and surfacing mats; inorganic fiber cloth including synthetic and natural cloth, such as asbestos cloth and metal fiber cloth; woven fabrics and nonwoven fabrics obtained from liquid-crystal fibers such as wholly-aromatic polyamide fibers, wholly-aromatic polyester fibers and polybenzoxazole fibers; woven fabrics and nonwoven fabrics obtained from synthetic fibers such as polyvinyl alcohol fibers, polyester fibers and acrylic fibers; natural fiber fabrics such a cotton, hemp and felt; carbon fiber cloth; and natural cellulosic cloth such as kraft paper, cotton paper and paper-glass mixed paper. The foregoing can be used singly or in concomitantly as two or more types.

The proportion of the base material in the curable composite material is preferably 5 to 90 wt %, more preferably 10 to 80 wt % and yet more preferably 20 to 70 wt %. When the base material is less than 5 wt %, the dimensional stability and strength after curing of the composite material are insufficient, while when the content of the base material is higher than 90 wt %, the dielectric properties of the composite material become impaired, which is undesirable.

In the curable composite material of the present invention a coupling agent can be used as needed for the purpose of improving adhesiveness at the interface between the base material and the resin. Ordinary coupling agents can be used herein, for instance silane coupling agents, titanate coupling agents, aluminum coupling agents and zircoaluminate coupling agents.

The method for producing the curable composite material of the present invention may involve for instance uniformly dissolving or dispersing the curable resin composition of the present invention and other components, as needed, for instance in an aromatic or ketone-based solvent described above, or a mixed solvent thereof, and then impregnating a base material, followed by drying. Impregnation is accomplished for instance through immersion (dipping) or coating. Impregnation can be repeated a plurality of times, as needed. Herein, impregnation can be repeated using a plurality of solutions having different compositions and/or concentrations, to thereby adjust the resin composition and amount of resin as ultimately desired.

A cured composite material is then obtained through curing of the curable composite material of the present invention in accordance with a method such as heating. The production method involved is not particularly limited, and for instance a cured composite material of desired thickness can be obtained by laying up a plurality of layers of curable composite material, followed by heat curing simultaneously with bonding of the layers to each other, under heating and pressing. A cured composite material resulting bonded and cured once may then be combined with a further curable composite material, to yield a cured composite material having a new layer build-up. Lamination molding and curing can be carried out simultaneously using for instance an ordinary heat press, but lamination molding and curing may each be carried out independently. That is, an uncured or semi-cured composite material obtained beforehand through lamination molding may then be cured by being thermally treated or being processed in accordance with some other method.

Curing, or molding and curing, of the curable resin composition or the curable composite material of the present invention can be performed preferably at a temperature of 80° C. to 300° C., under a pressure of 0.1 to 1000 kg/cm$^2$, and for 1 minute to 10 hours, more preferably at a temperature of 150° C. to 250° C., under a pressure of 1 to 500 kg/cm$^2$, and for 1 minute to 5 hours.

The laminate of the present invention is made up of layers of the cured composite material of the present invention and metal foil layers. The metal foil used herein may be for instance a copper foil or aluminum foil. The thickness of the metal foil is not particularly limited, and lies in the range of 3 to 200 μm, more preferably 3 to 105 μm.

The method for producing the laminate of the present invention may involve for instance laying up a curable composite material, obtained from the curable resin composition of the present invention explained above, and from a base material, with a metal foil, to yield a layer build-up according to a desired purpose, followed by heat curing simultaneously with bonding of the layers to each other under heating and pressing. The laminate of the curable resin composition of the present invention is a stack of the cured composite material and the metal foil according to an arbitrary layer build-up. The metal foil may be used both as a surface layer and as an intermediate layer. Further, a multilayer laminate can be achieved through repeated lamination and curing a plurality of times.

An adhesive can be used for bonding to the metal foil. The adhesive is not particularly limited, and an epoxy-based, acrylic-based, phenolic-based or cyanoacrylate-based adhesive can be used herein. Lamination molding and curing can be carried out under conditions identical to those during the production of the cured composite material of the present invention.

A film being an implementation of the curable resin composition of the present invention can be obtained by molding the curable resin composition of the present invention into a film shape. The thickness of the film is not particularly limited, but lies preferably in the range of 3 to 200 μm, more preferably 5 to 105 μm.

The method for producing the film of the present invention is not particularly limited and may involve for instance dissolving or dispersing uniformly the curable resin composition in a solvent, for instance an aromatic solvent or ketone-based solvent, or a mixed solvent thereof, and then applying the resulting product onto a resin film such as a PET film, followed by drying. Application can be repeated a plurality of times, as needed. Herein, application can be repeated using a plurality of solutions having different compositions and/or concentrations, to adjust the resin composition and amount of resin as ultimately desired.

The metal foil with resin of the present invention is made up of the curable resin composition of the present invention and a metal foil. The metal foil used herein may be for instance a copper foil or aluminum foil. The thickness of the metal foil is not particularly limited, but lies preferably in the range of 3 to 200 μm, more preferably 5 to 105 μm.

The method for producing the metal foil with resin of the present invention is not particularly limited and may involve for instance dissolving or dispersing uniformly the curable resin composition in a solvent, for instance an aromatic solvent or ketone-based solvent, or a mixed solvent thereof, and then applying the resulting product onto metal foil, followed by drying.

Application can be repeated a plurality of times, as needed. Herein, application can be repeated using a plurality of solutions having different compositions and/or concentrations, to thereby adjust the resin composition and amount of resin as ultimately desired.

EXAMPLES

The present invention will be explained next based on examples, but the invention is not limited it these examples. The term "part" in all the examples refers to parts by weight.

The physical property measurements in the examples were carried out in accordance with the methods below.

1) Molecular weight and molecular weight distribution of polymers

The molecular weight and the molecular weight distribution of soluble polyfunctional aromatic copolymers were measured using a calibration curve of monodisperse polystyrene by GPC (HLC-8120GPC, by Tosoh Corporation), with tetrahydrofuran as the solvent, and at a flow rate of 1.0 ml/min and a column temperature of 38° C.

2) Polymer Structure

Polymer structures were determined by $^{13}$C-NMR and $^1$H-NMR analysis using a nuclear magnetic resonance spectrometer model JNM-LA600, by JEOL Ltd. Chloroform-di was used as the solvent, and the resonance lines of tetramethylsilane were used as an internal standard.

3) Analysis of Terminal Groups

In the calculations of terminal groups, the introduction amount of specific structural units introduced to the terminals was worked out, in addition to the measurement results by $^{13}$C-NMR and $^1$H-NMR, also on the basis of data pertaining to the total amount of structural units introduced into the copolymer, obtained by GC analysis. The number of terminal groups of specific structural units included in one molecule of the polyfunctional vinyl aromatic copolymer was calculated on the basis of the number-average molecular weight obtained by GPC measurement and the introduction amount of specific structural units introduced to the terminals.

4) Glass transition temperature (Tg) of cured product

A glass substrate was coated with uniformly with a solution resulting from dissolving a polyfunctional vinyl aromatic copolymer in toluene, to a thickness after drying of 20 μm, and the whole was dried through heating at 90 ® C. for 30 minutes, using a hot plate. The obtained resin film was set, together with the glass substrate, on a TMA (thermo-mechanical analyzer), and was warmed at a rate of temperature rise of 10° C./minute up to 220° C., under a nitrogen stream, with a further thermal treatment at 220° C. for 20 minutes, to thereby remove residual solvent, and cure the polyfunctional vinyl aromatic copolymer. The glass substrate was cooled down to room temperature; thereafter, an analysis probe was brought into contact with the sample in the TMA measuring device, and a scanning measurement was carried out from 30° C. to 360° C., at a rate of temperature rise of 10° C./minute, under a nitrogen stream, to work out the softening temperature in accordance with a tangent method.

5) Evaluation Heat Resistance and Measurement of Thermal Discoloration Resistance The heat resistance of the soluble polyfunctional vinyl aromatic copolymer was evaluated by setting a sample on a TGA (thermobalance) measuring device, and through scanning at a rate of temperature rise of 10° C./minute from 30° C. to 400° C., under a nitrogen stream, to work out the magnitude of weight reduction at 350° C. as an index of heat resistance. To measure thermal discoloration resistance, 6.0 g of the soluble polyfunctional vinyl aromatic copolymer, 4.0 g of benzyl methacrylate and 0.02 g of t-butyl peroxy-2-ethyl hexanoate (Perbutyl 0, by NOF Corporation) were mixed, with heating at 200° C. for 1 hour, under a nitrogen stream, to yield a cured product. Thermal discoloration resistance was evaluated by checking visually the degree of color change in the obtained cured product, and by rating that degree of color change in accordance with the following criteria: good (○): no thermal discoloration; fair (Δ): pale yellow; poor (X): yellow.

6) Measurement of Compatibility

To measure the compatibility of the soluble polyfunctional vinyl aromatic copolymer with an epoxy resin, 5.0 g of a respective sample, 3.0 g of an epoxy resin (bisphenol A liquid epoxy resin: Epikote 828, by Japan Epoxy Resins Co.) and 2.0 g of a phenolic resin (melamine-skeleton phenolic resin: PS-6492, by Gun Ei Chemical Industry Co., Ltd.), were dissolved in 10 g of methyl ethyl ketone (MEK), and the transparency of the sample after dissolution was checked visually. Compatibility was then evaluated on the basis of a classification into good (○): transparent; fair (Δ): semi-transparent, and poor (X): non-transparent or insoluble.

Example 1

Herein, 3.0 moles (390.6 g) of divinylbenzene, 1.8 moles (229.4 g) of ethyl vinylbenzene, 10.2 moles (1066.3 g) of styrene and 15.0 moles (1532.0 g) of n-propyl acetate were charged into a 5.0 L reactor, then 600 millimoles of a diethyl ether complex of boron trifluoride were added at 70° C., and the reaction was allowed to proceed for 4 hours. The polymerization reaction was stopped using an aqueous solution of sodium hydrogen carbonate, followed by washing of the oil layer thrice using pure water, and vacuum devolatilization at 60° C., to recover a copolymer. The resulting copolymer was weighed, and it was found that 896.7 g of copolymer A had been obtained.

The obtained copolymer A had Mn of 2980, Mw of 41300 and Mw/Mn of 13.9. Resonance lines derived from the terminals of Formulae (t1), (t2), (t3) were observed in copolymer A as a result of $^{13}$C-NMR and $^1$H-NMR analyses. The structural units of copolymer A were calculated as described below on the basis of for instance the NMR measurement result, the result of GC analysis, and number-average molecular weight on a standard polystyrene basis.
Terminal group of Formula (t1): 1.49 mol %
Terminal group of Formula (t2): 1.31 mol %
Terminal group of Formula (t3): 2.21 mol %
Structural units derived from divinylbenzene (a): 30.4 mol % (33.1 wt %)
Structural units derived from ethyl vinylbenzene (c): 12.2 mol % (14.2 wt %)
Structural units derived from styrene (b): 57.4 mol % (52.7 wt %)
Structural units having residual vinyl groups derived from divinylbenzene (a): 23.9 mol % (25.9 wt %)
Mole fraction of (a1), (t1), (t2), and (t3) with respect to sum total of (a), (b), and (c): 0.27
Introduction amount of vinyl group-containing terminal group (tv): 0.66 (groups/molecule)
Mole fraction of (t3) with respect to sum total of (t1), (t2), and (t3): 0.44

The result of a TMA measurement of the cured product revealed a softening temperature of 300° C. or higher, with no clear Tg observed. The result of the TGA measurement revealed a weight decrease at 350° C. of 1.83 wt %, and good (○) thermal discoloration resistance. Compatibility with the epoxy resin was good (○).

Copolymer A was soluble in toluene, xylene, THF, dichloroethane, dichloromethane and chloroform (100 g or more of copolymer A dissolved in solvent 100 g of each solvent), with no observable gelling.

Example 2

Herein, 1.5 moles (195.3 g) of divinylbenzene, 0.88 moles (114.7 g) of ethyl vinylbenzene, 12.6 moles (1314.3 g) of styrene and 15.0 moles (1532.0 g) of n-propyl acetate were charged into a 5.0 L reactor, then 600 millimoles of a diethyl ether complex of boron trifluoride were added at 70° C., and the reaction was allowed to proceed for 4 hours. The polymerization reaction was stopped using an aqueous solution of sodium hydrogen carbonate, followed by washing of the oil layer thrice using pure water, and vacuum devolatilization at 60° C., to recover a copolymer. The resulting copolymer was weighed, and it was found that 820.8 g of copolymer B had been obtained.

The obtained copolymer B had Mn of 1490, Mw of 12600 and Mw/Mn of 8.44. Resonance lines derived from the terminals of Formulae (t1), (t2), (t3) were observed in copolymer B as a result of $^{13}$C-NMR and $^1$H-NMR analyses. The structural units of copolymer B were calculated as described below on the basis of for instance the NMR measurement result, the result of GC analysis, and number-average molecular weight on a standard polystyrene basis.
Terminal group of Formula (t1): 3.55 mol %
Terminal group of Formula (t2): 3.38 mol %
Terminal group of Formula (t3): 4.07 mol %
Structural units derived from divinylbenzene (a): 11.3 mol % (13.5 wt %)
Structural units derived from ethyl vinylbenzene (c): 5.79 mol % (7.04 wt %)

Structural units derived from styrene (b): 82.9 mol % (79.4 wt %)
Structural units having residual vinyl groups derived from divinylbenzene (a): 10.1 mol % (10.8 wt %)
Mole fraction of (a1), (t1), (t2), and (t3) with respect to sum total of (a), (b), and (c): 0.21
Introduction amount of vinyl group-containing terminal group (tv): 0.60(groups/molecule)
Mole fraction of (t3) with respect to sum total of (t1), (t2), and (t3): 0.36

The result of a TMA measurement of the cured product revealed a softening temperature of 300° C. or higher, with no clear Tg observed. The result of the TGA measurement revealed a weight decrease at 350° C. of 2.01 wt %, and good (○) thermal discoloration resistance. Compatibility with the epoxy resin was good (○).

Copolymer B was soluble in toluene, xylene, THF, dichloroethane, dichloromethane and chloroform (100 g or more of copolymer B dissolved in solvent 100 g of each solvent), with no observable gelling.

Example 3

Herein, 2.25 moles (292.9 g) of divinylbenzene, 1.32 moles (172.0 g) of ethyl vinylbenzene, 11.4 moles (1190.3 g) of styrene and 15.0 moles (1532.0 g) of n-propyl acetate were charged into a 5.0 L reactor. Then 600 millimoles of a diethyl ether complex of boron trifluoride were added at 70° C., and the reaction was allowed to proceed for 4 hours. The polymerization reaction was stopped using an aqueous solution of sodium hydrogen carbonate, followed by washing of the oil layer thrice using pure water, and vacuum devolatilization at 60° C., to recover a copolymer. The resulting copolymer was weighed, and it was found that 860.8 g of copolymer C had been obtained.

The obtained copolymer C had Mn of 2060, Mw of 30700 and Mw/Mn of 14.9. Resonance lines derived from the terminals of Formulae (t1), (t2), (t3) were observed in copolymer C as a result of $^{13}$C-NMR and $^1$H-NMR analyses. The structural units of copolymer C were calculated as described below on the basis of for instance the NMR measurement result, the result of GC analysis, and number-average molecular weight on a standard polystyrene basis.
Terminal group of Formula (t1): 2.92 mol %
Terminal group of Formula (t2): 2.51 mol %
Terminal group of Formula (t3): 2.76 mol %
Structural units derived from divinylbenzene (a): 20.9 mol % (24.3 wt %)
Structural units derived from ethyl vinylbenzene (c): 9.1 mol % (10.7 wt %)
Structural units derived from styrene (b): 70.0 mol % (65.0 wt %)
Structural units having residual vinyl groups derived from divinylbenzene (a): 16.7 mol % (18.5 wt %)
Mole fraction of (a1), (t1), (t2), and (t3) with respect to sum total of (a), (b), and (c): 0.27
Introduction amount of vinyl group-containing terminal group (tv): 0.65(groups/molecule)
Mole fraction of (t3) with respect to sum total of (t1), (t2), and (t3): 0.34

The result of a TMA measurement of the cured product revealed a softening temperature of 300° C. or higher, with no clear Tg observed. The result of the TGA measurement revealed a weight decrease at 350° C. of 2.11 wt %, and good (0) thermal discoloration resistance. Compatibility with the epoxy resin was good (0).

The copolymer C was soluble in toluene, xylene, THF, dichloroethane, dichloromethane and chloroform (100 g or more of copolymer C dissolved in solvent 100 g of each solvent), with no observable gelling.

Example 10

Herein, 3.1 moles (404.5 g) of divinylbenzene, 1.8 moles (237.6 g) of ethyl vinylbenzene, 7.5 moles (780.7 g) of styrene and 13.0 moles (1325.7 g) of n-propyl acetate were charged into a 5.0 L reactor. Then 193 millimoles of a diethyl ether complex of boron trifluoride were added at 70° C., and the reaction was allowed to proceed for 4 hours. The polymerization solution reaction was stopped using an aqueous solution of sodium hydrogen carbonate, followed by washing of the oil layer thrice using pure water, and vacuum devolatilization at 60° C., to recover a copolymer. The resulting copolymer was weighed, and it was found that 689.2 g of copolymer F had been obtained.

The obtained copolymer F had Mn of 2940, Mw of 39500 and Mw/Mn of 13.9. Resonance lines derived from the terminals of Formulae (t1), (t2), (t3) were observed in copolymer F as a result of $^{13}$C-NMR and $^1$H-NMR analyses. The structural units of copolymer F were calculated as described below on the basis of for instance the NMR measurement result, the result of GC analysis, and number-average molecular weight on a standard polystyrene basis.
Terminal group of Formula Op: 1.52 mol %
Terminal group of Formula (t2): 1.24 mol %
Terminal group of Formula (t3): 2.16 mol %
Structural units derived from divinylbenzene (a): 36.8 mol % (40.7 wt %)
Structural units derived from ethyl vinylbenzene (c): 14.5 mol % (16.3 wt %)
Structural units derived from styrene (b): 48.6 mol % (43.0 wt %)
Structural units having residual vinyl groups derived from divinylbenzene (a): 25.8 mol % (28.5 wt %)
Mole fraction of (a1), (t1), (t2), and (t3) with respect to sum total of (a), (b), and (c): 0.34 Introduction amount of vinyl group-containing terminal group (tv): 0.73 (groups/molecule)
Mole fraction of (t3) with respect to sum total of (t1), (t2), and (t3): 0.41

The result of a TMA measurement of the cured product yielded no clear Tg observable. The softening temperature was 300° C. or higher. The result of the TGA measurement revealed a weight decrease at 350° C. of 1.32 wt %, and good (0) thermal discoloration resistance. Compatibility with the epoxy resin was good (0).

The copolymer F was soluble in toluene, xylene, THF, dichloroethane, dichloromethane and chloroform (100 g or more of copolymer F dissolved in solvent 100 g of each solvent), with no observable gelling.

Comparative Example 1

Herein, 1.82 moles (259.6 mL) of divinylbenzene (mixture of 1,4-divinylbenzene and 1,3-divinylbenzene; likewise in examples hereafter), 0.43 moles (60.9 mL) of ethyl vinylbenzene (mixture of 1-ethyl-4-vinylbenzene and 1-ethyl-3-vinylbenzene; likewise in examples hereafter), 0.28 moles (36.9 mL) of n-butyl acetate and 140 mL of toluene were charged into a 1.0 L reactor, then there was added, at 70° C., a solution resulting from dissolving 40 millimoles of methanesulfonic acid in 0.12 moles (15.7 mL) of n-butyl acetate, and the reaction was allowed to proceed for 6 hours. The polymerization reaction was stopped with calcium hydroxide, after which the solution was filtered using active alumina as a filter aid. This was followed by vacuum devolatilization at 60° C., to recover a polymer. The obtained polymer was as weighed, and it was found that 222.6 g of copolymer D had been obtained.

The obtained copolymer D had Mn of 1085, Mw of 12400 and Mw/Mn of 11.4.

There were observed no resonance lines in copolymer D derived from the terminals of Formulae (t1) and (t2), as a result of $^{13}$C-NMR and $^{1}$H-NMR analyses. The structural units of the copolymer D were calculated as described below on the basis of for instance the NMR measurement result, the result of GC analysis, and number-average molecular weight on a standard polystyrene basis.

Terminal group of Formula (t3): 11.4 mol %
Structural units derived from divinylbenzene (a): 84.0 mol % (84.2 wt %)
Structural units derived from ethyl vinylbenzene (c): 16.0 mol % (15.8 wt %)
Structural units derived from styrene (b): none
Structural units having residual vinyl groups derived from divinylbenzene (a): 51 mol % (51.1 wt %)
Mole fraction of (a1), (t1), (t2), and (t3) with respect to sum total of (a), (b), and (c): 0.86
Introduction amount of vinyl group-containing terminal group (tv): 0.11 (groups/molecule)
Mole fraction of (t3) with respect to sum total of (t1), (t2), and (t3): 1.0

The result of a DMA measurement on the cured product yielded a Tg of 256° C. The result of a TMA measurement of the cured product revealed a softening temperature of 300° C. or higher. The result of the TGA measurement revealed a weight decrease at 350° C. of 1.21 wt %, and good (O) thermal discoloration resistance. Compatibility with the epoxy resin was good (O).

Copolymer D was soluble in toluene, xylene, THF, dichloroethane, dichloromethane and chloroform (100 g or more of copolymer D dissolved in solvent 100 g of each solvent), with no observable gelling.

Comparative Example 2

Herein, 2.03 moles (288.5 mL) of divinylbenzene, 0.084 moles (12.0 mL) of ethyl vinylbenzene, 2.11 moles (241.7 mL) of styrene, 2.25 moles (427.3 mL) of 2-phenoxyethyl methacrylate, 100.0 mL of butyl acetate and 1150 mL of toluene were charged into a 3.0 L reactor, then a 300 millimoles of a diethyl ether complex of boron trifluoride were added at 50° C., and the reaction was allowed to proceed for 4 hours. The polymerization reaction was stopped using an aqueous solution of sodium hydrogen carbonate, followed by washing of the oil layer thrice with pure water, and charging of the reaction mixed solution, at room temperature, into a large amount of methanol, to precipitate a polymer. The obtained polymer was washed with methanol, and was filtered, dried, and weighed, to yield 282.4 g of copolymer E.

The obtained copolymer E had Mn of 2030, Mw of 5180 and Mw/Mn of 2.55. Resonance lines from the 2-phenoxyethyl methacrylate terminal were observed in copolymer E as a result of $^{13}$C-NMR and $^{1}$H-NMR analyses. The results of an elemental analysis of copolymer E were C: 87.3 wt %, H: 7.4 wt % and O: 5.2 wt %. The introduction amount of structural units derived from 2-phenoxyethyl methacrylate in the soluble polyfunctional vinyl aromatic copolymer, calculated on the basis of the result of elemental analysis, and the number-average molecular weight on a standard polystyrene basis, was 2.3 (groups/molecule).

The mole fraction of structural units derived from the divinyl aromatic compound (a) and the ethyl vinyl aromatic compound (c) was 1.00, on the basis of FT-IR measurement results. The copolymer contained 59.2 mol % of structural units derived from divinylbenzene and a total of 40.8 mol % of structural units derived from styrene and ethyl vinylbenzene. The structural units having residual vinyl groups included in copolymer E were 35.3 mol %.

The result of a DMA measurement on the cured product yielded a Tg of 197° C. The result of a TMA measurement of the cured product revealed a softening temperature of 300° C. or higher. The result of the TGA measurement revealed a weight decrease at 350° C. of 4.86 wt %, and good (O) thermal discoloration resistance. Compatibility with the epoxy resin was fair (Δ).

Copolymer E was soluble in toluene, xylene, THF, dichloroethane, dichloromethane and chloroform (100 g or more of copolymer E dissolved in solvent 100 g of each solvent), with no observable gelling.

Copolymers A to F obtained in Examples 1 to 3 and 10 and Comparative examples 1 and 2 were used for evaluating the characteristics of the varnish of the curable resin compositions in which these copolymers were utilized, and of the cured products, in accordance with the test methods below.

7) Solution Viscosity

The viscosity of the varnish solution of each curable resin composition was measured using an E-type viscometer, at a measurement temperature of 25° C.

8) Flexural Strength and Flexural Elongation at Break

A test piece used for a flexural test was obtained by placing a varnish of a curable resin composition on a lower molding die of a vacuum press molding machine, and the solvent was devolatilized through heating under vacuum. Thereafter, the upper die was set, and heat pressing was performed under vacuum, a flat plate having a thickness of 1.0 mm was then molded through holding at 200° C. for 1 hour.

A test piece having width: 5.0 mm, thickness: 1.0 mm and length of 120 mm was prepared out of the flat plate obtained through molding and was subjected to a flexural test. The flexural strength and the flexural elongation at break of the produced flexural test piece were measured using a universal tester. The flexural strength and flexural elongation at break were evaluated according to the ratings below, with respect to a reference combination: good (◯) value smaller than ±10%, excellent (⊗) value equal to or higher than 10%, fair (Δ) value in the range of −10% to −20%, and poor (X) value equal to or lower than −20%.

9) Coefficient of Linear Expansion and Glass Transition Temperature

A test piece used for tests of coefficient of linear expansion and glass transition temperature were obtained by placing a varnish of the respective curable resin composition on a flat plate-like lower molding die of a vacuum press molding machine, and the solvent was devolatilized through heating under vacuum. Thereafter a 0.2 mm spacer was interposed, the upper die was set, and heat pressing was carried out under vacuum. A flat plate having a thickness of 0.2 mm was shaped through holding at 200° C. for 1 hour. A test piece having width: 3.0 mm, thickness: 0.2 mm and length of 40 mm was prepared out of the flat plate obtained through molding, was set only on the upper chuck of a TMA (thermomechanical analyzer), was warmed at a rate of temperature rise of 10° C./minute up to 220° C., under a nitrogen stream, and was further thermally treated at 220° C. for 20 minutes, to thereby remove residual solvent, and eliminate molding strain within the test piece. Then the TMA was left to cool down to room temperature, an analysis probe was set under the test piece in the TMA measuring device, and a scan measurement was performed from 30° C. to 360° C. at a rate of temperature rise of 10° C./minute, under a nitrogen stream. The coefficient of linear expansion was calculated on the basis of the dimensional change from 0° C. to 40° C.

To calculate the glass transition temperature, the above test piece was set in a DMA (dynamic viscoelasticity device) measuring device, a measurement was carried out through scanning at a rate of temperature rise of 3° C./minute from 30° C. to 320° C., under a nitrogen stream, and Tg was worked out from the peak top of a tan δ curve.

10) Permittivity and Dielectric Tangent

Permittivity and dielectric tangent at 18 GHz were measured using a flat plate test piece of a cured product, absolutely dried and having thereafter been kept for 24 hours in a room at a temperature of 23° C. and a humidity of 50%, utilizing a permittivity measuring device relying on the cavity method, by AET, Inc., on the basis of the JIS C 2565 standard.

The flat-plate test piece of the cured product was allowed to stand for two weeks at 85° C. and at relative humidity of 85%, after which permittivity and dielectric tangent were measured. The permittivity and dielectric tangent after a wet heat resistance test were measured (permittivity 85, dielectric tangent 85).

In order to further check the resistance to high-temperature thermal oxidative degradation of the material, the flat-plate test piece of the cured product was allowed to stand at 140° C. in an air atmosphere for 168 hours, after which permittivity and dielectric tangent were measured. The permittivity and dielectric tangent after the test of resistance to high-temperature to thermal oxidative degradation were then measured (permittivity 140, dielectric tangent 140).

11) Copper foil peel strength

A glass cloth (E glass, basis weight 71 g/m²) was impregnated with a varnish of a respective curable resin composition, and the cloth was dried for 10 minutes in an air oven at 80° C. The resin content (R.C) of the prepreg to be obtained was adjusted to 50 wt %.

Using the above prepreg, the curable composite material was overlaid as a plurality of plies, as needed, so that the thickness after molding was about 0.6 mm to 1.0 mm, and a 18 μm copper foil (product name F2-WS copper foil, Rz: 2.0 μM, Ra: 0.3 μm) was laid on both faces of the curable composite material, followed by molding and curing using a vacuum press molding machine, to yield a laminate for evaluation. The curing conditions included raising the temperature at 3° C./minute and holding a temperature of 200° C. for 60 minutes, at 3 MPa, to yield a laminate cured product as a copper clad laminate for evaluation.

A test piece having a width of 20 mm and a length of 100 mm was cut out from the laminate cured product thus obtained, and parallel incisions at a width of 10 mm were made on the copper foil surface. Thereafter, the copper foil was stripped continuously at a rate of 50 mm/minute, in a 90° direction with respect to the surface, the stress generated at that time was measured using a tensile tester, and the lowest value of that stress was recorded as the copper foil peel strength (in accordance with JIS C 6481).

The test of copper foil peel strength after the wet heat resistance test involved allowing the test piece to stand for two weeks at 85° C. and relative humidity of 85%, followed by a measurement identical to the one above (copper foil peel strength 85).

12) Moldability

A core material was prepared that had a grid-like pattern of lines having a width (L) of 0.5 mm, at a spacing (S) between lines of 1.0 mm (L/S=0.5/1.0 mm), using the copper clad laminate for evaluation having been molded in the previous section. This core material was blackened, a prepreg was then laid up on the core material, and secondary molding was carried out, to prepare a laminated substrate for evaluation having an inner layer with a grid-like pattern. Then for instance the occurrence of defects such as voids derived from insufficient flowability of the resin varnish was checked in the laminated substrate for evaluation thus prepared. Subsequently, the laminated substrate for evaluation was immersed in boiling water for 4 hours, and thereafter was dipped in a solder bath at 280° C. Herein, substrates with no observable presence of voids, and in which no failure phenomenon were observable, such as swelling, delamination or measling (white spots), even after immersion in the solder bath, were rated as good "○", substrates in which the occurrence of the above failure phenomena was not observable but in which warping occurred were rated as fair "Δ", and substrates in which the above failure phenomena occurred were rated as poor Example 4

Herein, 20 g of copolymer A obtained in Example 1, 0.1 g of Perbutyl P as a polymerization initiator and 0.04 g of AO-60 as an antioxidant were dissolved in 8.6 g of toluene, to yield a curable resin composition (varnish A).

The prepared varnish A was dripped onto a lower molding die, and the solvent was devolatilized under reduced pressure at 130° C., after which the mold was assembled, and vacuum pressing was conducted for 1 hour at conditions of 200° C. and 3 MPa, to elicit thermal curing. The obtained flat-plate test piece of a cured product having a thickness of 0.2 mm was measured for various characteristics including permittivity and dielectric tangent at 18 GHz. The flat-plate test piece of the cured product was allowed to stand for two weeks at 85° C. and at relative humidity of 85%, after which permittivity and dielectric tangent were measured. The permittivity and dielectric tangent after a wet heat resistance test were likewise measured. The results obtained in the measurements are given in Table 1.

Examples 5 to 7, Comparative Examples 3 and 4

Curable resin compositions (varnishes) were obtained in accordance with the same method as in Example 4, but herein with the formulations given in Table 1. A flat-plate test piece of each cured product was prepared in the same way as in Example 4 and was tested and evaluated for the same items as in Example 4. The results obtained in the tests are given in Table 1.

The solids for the solution viscosity in the table are 70%. The reference symbol ND for glass transition temperature signifies Tg-less.

TABLE 1

|  | Example 4 | Example 5 | Example 6 | Example 7 | Comparative example 3 | Comparative example 4 |
|---|---|---|---|---|---|---|
| Copolymer A (wt %) | 100 | | | | | |
| Copolymer B (wt %) | | 100 | | | | |
| Copolymer C (wt %) | | | 100 | 100 | | |
| Copolymer D (wt %) | | | | | 100 | |
| Copolymer E (wt %) | | | | | | 100 |
| Perbutyl P (phr) | 0.5 | 0.5 | 0.5 | | 0.5 | 0.5 |
| Nofmer BC-90 (phr) | | | | 1.0 | | |
| ADK Stab AO-60 (phr) | 0.2 | 0.2 | 0.2 | 0.2 | 0.2 | 0.2 |
| Solution viscosity (mPa · s) | 132.5 | 74.6 | 92.5 | 92.5 | 58.5 | 87.2 |
| Flexural strength (MPa) | ○ | ○ | ○ | ○ | Δ | Δ |
| Flexural elongation at break (%) | ○ | ○ | ○ | ○ | ○ | ○ |
| Coefficient of linear expansion (ppm/° C.) | 69.3 | 72.8 | 70.2 | 71.1 | 81.5 | 86.4 |
| Glass transition temperature (° C.) | 211 | 166 | 185 | 187 | 197 | ND |
| Permittivity | 2.550 | 2.464 | 2.512 | 2.476 | 2.571 | 2.472 |
| Dielectric tangent ($\times 10^{-3}$) | 1.10 | 0.88 | 0.97 | 0.81 | 1.06 | 1.80 |
| Permittivity 85 | 2.546 | 2.475 | 2.514 | 2.481 | 2.782 | 2.491 |
| Dielectric 85 tangent ($\times 10^{-3}$) | 1.12 | 0.91 | 0.99 | 0.83 | 2.54 | 2.10 |
| Dielectric tangent change rate 1 (%) | 1.8 | 3.4 | 2.1 | 2.5 | 140.0 | 16.7 |
| Permittivity 140 | 2.579 | 2.500 | 2.504 | 2.477 | 2.628 | 2.491 |
| Dielectric tangent 140 ($\times 10^{-3}$) | 1.11 | 0.97 | 1.01 | 0.95 | 4.52 | 6.67 |
| Dielectric tangent change rate 2 (%) | 0.9 | 6.6 | 2.0 | 17.3 | 326.4 | 270.6 |
| Moldability | ○ | ○ | ○ | ○ | Δ | Δ |

Examples 8, 9 and 11 to 24, Comparative Examples 5 to 7

Curable resin compositions (varnishes) were obtained in accordance with the same method as in Example 4, but herein with the formulations given in Tables 2 to 5. A flat-plate test piece of each cured product was prepared in the same way as in Example 4 and was tested and evaluated for the same items as in Example 4. The results obtained in the tests are given in Tables 2 to 5. The varnish concentration (solids concentration) was set to 60 wt %.

A prepreg, a copper clad laminate for testing and a plated laminate for testing were produced in accordance with the methods described in 11) and 12) above, using the varnishes illustrated in the examples and comparative examples, and were evaluated for copper foil peel strength, and moldability. The test results are given in Tables 2 to 5.

TABLE 2

|  | Example 8 | Example 9 | Comparative example 5 | Comparative example 6 |
|---|---|---|---|---|
| Copolymer A (wt %) | 50 | | | |
| Copolymer C (wt %) | | 50 | | |
| Copolymer D (wt %) | | | 50 | |
| Copolymer E (wt %) | | | | 50 |
| Modified PPE-A (wt %) | 50 | 50 | 50 | 50 |
| Perbutyl P (phr) | 0.5 | 0.5 | 0.5 | 0.5 |
| ADK Stab AO-60 (phr) | 0.2 | 0.2 | 0.2 | 0.2 |
| Solution viscosity (mPa · s) | 363 | 321 | 287 | 375 |
| Flexural strength (MPa) | ○ | ○ | Δ | Δ |
| Flexural elongation at break (%) | ○ | ○ | ○ | Δ |
| Coefficient of linear expansion (ppm/° C.) | 64.7 | 68.4 | 81.8 | 81.6 |

TABLE 2-continued

|  | Example 8 | Example 9 | Comparative example 5 | Comparative example 6 |
| --- | --- | --- | --- | --- |
| Glass transition temperature (° C.) | 235 | 205 | 217 | 232 |
| Permittivity | 2.637 | 2.612 | 2.684 | 2.687 |
| Dielectric tangent ($\times 10^{-3}$) | 1.88 | 1.83 | 2.03 | 3.31 |
| Permittivity 85 | 2.641 | 2.589 | 2.734 | 2.703 |
| Dielectric tangent 85 ($\times 10^{-3}$) | 1.94 | 1.86 | 2.56 | 4.21 |
| Dielectric tangent change rate 1 (%) | 3.2 | 1.6 | 26.1 | 27.2 |
| Permittivity 140 | 2.656 | 2.581 | 2.755 | 2.766 |
| Dielectric tangent 140 ($\times 10^{-3}$) | 2.01 | 1.98 | 4.37 | 8.87 |
| Dielectric tangent change rate 2 (%) | 3.6 | 6.5 | 115.3 | 168.0 |
| Copper foil peel strength (N/mm) | 0.95 | 1.02 | 0.67 | 0.57 |
| Copper foil peel strength 85 (N/mm) | 0.83 | 0.93 | 0.28 | 0.33 |
| Moldability | ○ | ○ | Δ | Δ |

TABLE 3

|  | Example 11 | Example 12 | Example 13 | Example 14 | Comparative example 7 |
| --- | --- | --- | --- | --- | --- |
| Copolymer A (wt %) |  |  |  | 30 |  |
| Copolymer F (wt %) | 100 | 50 | 70 |  |  |
| Modified PPE-A (wt %) |  | 50 | 30 | 70 | 100 |
| Styrene copolymer A (wt %) |  |  |  |  |  |
| Styrene copolymer B (wt %) |  |  |  |  |  |
| Perbutyl P (phr) | 0.5 | 0.5 | 0.5 | 0.5 | 0.5 |
| Nofmer BC-90 (phr) |  |  |  |  |  |
| ADK Stab AO-60 (phr) | 0.2 | 0.2 | 0.2 | 0.2 | 0.2 |

TABLE 3-continued

|  | Example 11 | Example 12 | Example 13 | Example 14 | Comparative example 7 |
| --- | --- | --- | --- | --- | --- |
| Solution viscosity (mPa·s) | 165 | 362 | 225 | 263 | 375 |
| Flexural strength (MPa) | ○ | ○ | ○ | ○ | ○ |
| Flexural elongation at break (%) | ○ | ○ | ○ | ○ | ○ |
| Coefficient of linear expansion (ppm/° C.) | 69.4 | 67.6 | 69.7 | 70.5 | 75.2 |
| Glass transition temperature (° C.) | 223 | 227 | 224 | 234 | 254 |
| Permittivity | 2.462 | 2.634 | 2.551 | 2.614 | 2.673 |
| Dielectric tangent ($\times 10^{-3}$) | 1.07 | 1.87 | 1.47 | 2.46 | 2.86 |
| Permittivity 85 | 2.471 | 2.617 | 2.567 | 2.632 | 2.682 |
| Dielectric tangent 85 ($\times 10^{-3}$) | 1.09 | 1.91 | 1.51 | 2.63 | 3.21 |
| Dielectric tangent change rate 1 (%) | 1.9 | 2.1 | 2.7 | 6.9 | 12.2 |
| Permittivity 140 | 2.467 | 2.623 | 2.574 | 2.651 | 2.712 |
| Dielectric tangent 140 ($\times 10^{-3}$) | 1.10 | 2.41 | 2.07 | 3.56 | 5.23 |
| Dielectric tangent change rate 2 (%) | 2.8 | 28.9 | 40.8 | 44.7 | 82.9 |
| Copper foil peel strength (N/mm) | 0.70 | 0.95 | 0.79 | 0.97 | 0.86 |
| Copper foil peel strength 85 (N/mm) | 0.61 | 0.87 | 0.72 | 0.91 | 0.81 |
| Moldability | ○ | ○ | ○ | ○ | Δ |

TABLE 4

|  | Example 15 | Example 16 | Example 17 | Example 18 | Example 19 |
| --- | --- | --- | --- | --- | --- |
| Copolymer A (wt %) | 90 | 80 | 80 |  | 80 |
| Copolymer F (wt %) |  |  |  | 80 |  |
| Modified PPE-A (wt %) |  |  |  |  | 10 |
| Styrene copolymer A (wt %) | 10 | 20 |  | 20 | 10 |
| Styrene copolymer B (wt %) |  |  | 20 |  |  |
| Amorphous spherical silica (phr) |  |  |  |  | 100 |
| Perbutyl P (phr) | 0.5 | 0.5 | 0.5 | 0.5 | 0.5 |
| ADK Stab AO-60 (phr) | 0.2 | 0.2 | 0.2 | 0.2 | 0.2 |
| Solution viscosity (mPa·s) | 780 | 4230 | 4760 | 4360 | 1270 |
| Flexural strength (MPa) | ○ | ○ | ○ | ○ | ○ |
| Flexural elongation at break (%) | ○ | ○ | ○ | ○ | ○ |
| Coefficient of linear expansion (ppm/° C.) | 74.4 | 89.2 | 91.2 | 87.5 | 45.6 |
| Glass transition temperature (° C.) | 206 | 205 | 203 | 214 | 226 |

TABLE 4-continued

|  | Example 15 | Example 16 | Example 17 | Example 18 | Example 19 |
|---|---|---|---|---|---|
| Permittivity | 2.418 | 2.472 | 2.483 | 2.489 | 2.960 |
| Dielectric tangent ($\times 10^{-3}$) | 0.97 | 1.11 | 1.07 | 1.09 | 0.97 |
| Permittivity 85 | 2.453 | 2.475 | 2.504 | 2.503 | 2.971 |
| Dielectric tangent 85 ($\times 10^{-3}$) | 1.02 | 1.12 | 1.09 | 1.10 | 1.01 |
| Dielectric tangent change rate 1 (%) | 5.2 | 0.9 | 1.9 | 0.9 | 4.1 |
| Permittivity 140 | 2.426 | 2.511 | 2.508 | 2.513 | 2.983 |
| Dielectric tangent 140 ($\times 10^{-3}$) | 1.08 | 1.13 | 1.10 | 1.12 | 1.02 |
| Dielectric tangent change rate 2 (%) | 11.3 | 1.8 | 2.8 | 2.8 | 5.2 |
| Copper foil peel strength (N/mm) | 0.72 | 0.81 | 0.73 | 0.79 | 0.74 |
| Copper foil peel strength 85 (N/mm) | 0.67 | 0.72 | 0.65 | 0.71 | 0.69 |
| Moldability | ○ | ○ | ○ | ○ | Δ |

TABLE 5

|  | Example 20 | Example 21 | Example 22 | Example 23 | Example 24 |
|---|---|---|---|---|---|
| Copolymer A (wt %) | 80 |  |  |  | 70 |
| Copolymer F (wt %) |  | 80 | 70 | 75 |  |
| Modified PPE-A (wt %) |  |  |  | 5 |  |
| Styrene copolymer A (wt %) | 10 | 10 | 10 | 20 |  |
| Styrene copolymer C (wt %) |  |  |  |  | 20 |
| TAIC (wt %) | 10 |  |  |  |  |
| M-DCP (wt %) |  | 10 | 20 |  |  |
| DVBP (wt %) |  |  |  |  | 10 |
| Flame retardant A (phr) |  |  |  | 30 |  |
| Amorphous spherical silica (phr) |  |  |  | 70 |  |
| Perbutyl P (phr) | 0.5 | 0.5 | 0.5 | 0.5 | 0.5 |
| ADK Stab AO-60 (phr) | 0.2 | 0.2 | 0.2 | 0.2 | 0.2 |
| Solution viscosity (mPa·s) | 1150 | 1280 | 753 | 5260 | 3420 |
| Flexural strength (MPa) | ○ | ○ | ○ | ○ | ○ |
| Flexural elongation at break (%) | ○ | ○ | ○ | ○ | ○ |
| Coefficient of linear expansion (ppm/°C.) | 81.5 | 76.5 | 72.1 | 51.2 | 67.8 |
| Glass transition temperature (°C.) | 195 | 209 | 221 | 225 | 202 |
| Permittivity | 2.513 | 2.442 | 2.398 | 2.854 | 2.483 |
| Dielectric tangent ($\times 10^{-3}$) | 1.32 | 1.75 | 2.34 | 1.05 | 0.98 |
| Permittivity 85 | 2.653 | 2.457 | 2.411 | 2.862 | 2.492 |
| Dielectric tangent 85 ($\times 10^{-3}$) | 1.65 | 1.86 | 2.52 | 1.09 | 1.01 |
| Dielectric tangent change rate 1 (%) | 25.0 | 6.3 | 7.7 | 3.8 | 3.1 |
| Permittivity 140 | 2.638 | 2.452 | 2.423 | 2.871 | 2.478 |
| Dielectric tangent 140 ($\times 10^{-3}$) | 1.59 | 1.87 | 2.57 | 1.09 | 1.42 |
| Dielectric tangent change rate 2 (%) | 20.5 | 6.9 | 9.8 | 3.8 | 44.9 |
| Copper foil peel strength (N/mm) | 0.73 | 0.74 | 0.77 | 0.73 | 0.71 |
| Copper foil peel strength 85 (N/mm) | 0.65 | 0.64 | 0.68 | 0.61 | 0.63 |
| Moldability | ○ | ○ | ○ | ○ | ○ |

The components used in Table 1 to Table 5 are as follows.
Modified PPE-A: polyphenylene oligomer having a vinyl group at both terminals (Mn=1160, reaction product of chloromethyl styrene and a polycondensate of 2,2',3,3',5,5'-hexamethyl biphenyl-4,4'-diol.2,6-dimethyl phenol, by Mitsubishi Gas Chemical Company, Inc.)
Modified PPE-B: polyphenylene oligomer having a vinyl group at both terminals (Mn=2270, reaction product of chloromethyl styrene and a polycondensate of 2,2',3,3',5,5'-hexamethyl biphenyl-4,4'-diol.2,6-dimethyl phenol, by Mitsubishi Gas Chemical Company, Inc.)
Modified PPE-C: polyphenylene oligomer having a vinyl group at one terminal (Mn=2340, reaction product of polyphenylene ether (SA120, by SABIC Innovative Plastics) and chloromethyl styrene)
TAIC: triallyl isocyanurate (by Nippon Kasei Chemical Company Limited)
A-DCP: tricyclodecanedimethanol diacylate (by Shin Nakamura Chemical Co., Ltd.)
M-DCP: tricyclodecane dimethanol dimethacrylate (by Kyoeisha Chemical Co., Ltd.)
DVBP: divinyl biphenyl (by Nippon Steel & Sumikin Chemical Co., Ltd.) Flame retardant A: 1,2-bis(pentabromophenyl)ethane, SAYTEX8010 (by Albemarle)
YDCN700: o-cresol novolac-type epoxy resin, Epotohto YDCN-700-3 (low-viscosity type, by Nippon Steel & Sumikin Chemical Co., Ltd.)
HP4032D: naphthalene-skeleton liquid epoxy resin: EPICLON HP-4032D, Mw=304 (b, DIC Corporation)
Naphthol-type epoxy resin: ESN-475V, epoxy equivalents: 340 (by Nippon Steel & Sumikin Chemical Co., Ltd.)
Epikote 828: bisphenol A liquid epoxy resin: Epikote 828US, Mw=370 (by Japan Epoxy Resins Co.)
Fluorene-skeleton epoxy resin: Ogsol EG-200, by Osaka Gas Chemicals Co., Ltd.
Modified PPE-D: polyphenylene oligomer having an epoxy group at both terminals (Mn=1180, reaction product of epichlorohydrin and a polycondensate of 2,2',3,3',5,5'-hexamethyl biphenyl-4,4'-diol.2,6-dimethyl phenol, by Mitsubishi Gas Chemical Company, Inc.)
MEH7851: biphenyl-skeleton phenolic resin, MEH-7851-S by Meiwa Plastic Industries, Ltd.
PS6492: melamine-skeleton phenolic resin, PS-6492, by Gun Ei Chemical Industry Co., Ltd.
YLH903: phenolic resin having allyl group-containing skeleton, YLH-903, by Japan Epoxy Resins Co.
Alicyclic-skeleton acid anhydride: MH-700, by New Japan Chemical Co., Ltd.
Aromatic-skeleton acid anhydride: SMA Resin EF60, by Sartomer Japan Inc.
Styrenic copolymer A: KRATON A1535 (by Kraton Polymers LLC)
Styrenic copolymer B: KRATON A1536 (by Kraton Polymers LLC)
Styrenic copolymer C: Ricon181 (by Cray Valley)
Phenoxy resin: weight-average molecular weight 37000, "YL7553BH30" by Mitsubishi Chemical Corporation (1:1 solution of MEK and cyclohexanone, non-volatile fraction: 30 mass %)
Amorphous spherical silica: SE2050 SPE, by Admatechs Company Limited, average particle size 0.5 μm (treated with a phenylsilane coupling agent)
Perbutyl P: polymerization initiator, by NOF Corporation
Nofmer BC-90: 2,3-dimethyl-2,3-diphenylbutane, polymerization initiator, by NOF Corporation ADK Stab AO-60: an antioxidant, by ADEKA

INDUSTRIAL APPLICABILITY

The polyfunctional vinyl aromatic copolymer of the present invention can be worked into a molding material, sheet, or film, and can be used for instance as a low dielectric material, insulating material, heat-resistant material, or structural material capable of satisfying characteristics such as low permittivity, low water, and high heat resistance in fields such as the electrical, aerospace, aircraft, and automotive industries. In particular, the polyfunctional vinyl aromatic copolymer of the present invention can be used in single-sided and double-sided multilayer printed boards, flexible printed boards, and build-up boards. The polyfunctional vinyl aromatic copolymer of the present invention can be used for instance in semiconductor-related materials and optical materials, and also in coating materials, photosensitive materials, adhesives, sewage treatment agents, heavy metal scavengers, ion-exchange resins, antistatic agents, antioxidants, anti-fogging agents, rust inhibitors, dye-proofing agents, fungicides, insect repellents, medical materials, flocculants, surfactants, lubricants, solid fuel binders, conductive treatment agents, resin modifiers, asphalt modifiers, plasticizers, sintering binders and the like.

The curable resin composition of the present invention exhibits high-level dielectric properties (low permittivity/low dielectric tangent) even after a severe thermal history, affords a cured product having high adhesion reliability, even in harsh environments, and is excellent in resin flowability, boasting superior wiring embedding planarity, with low linear expansion. Accordingly, a cured molded article can be provided that accommodates the smaller sizes and thinner profiles strongly demanded in recent years, while free of molding failure phenomena such as warping, for instance as a dielectric material, insulating material, heat-resistant material, or structural material in fields such as the electrical/electronic and aerospace and aircraft industries. By virtue of the wiring embedding planarity, and superior adhesion to different materials, there can be achieved a curable resin composition, cured product, and material containing the foregoing that boast excellent reliability.

The invention claimed is:

1. A soluble polyfunctional vinyl aromatic copolymer being a polyfunctional vinyl aromatic copolymer that contains 2 mol % or more and less than 95 mol % of structural units derived from a divinyl aromatic compound (a), and contains 5 mol % or more and less than 98 mol % of structural units derived from styrene (b) and a monovinyl aromatic compound (c) other than styrene, wherein the copolymer satisfies the following conditions:
the polyfunctional vinyl aromatic copolymer contains structural units represented by Formula (a 1) and derived from the divinyl aromatic compound (a):

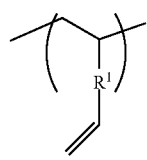

(a1)

in the formula, $R^1$ represents a C6 to C30 aromatic hydrocarbon group;

the polyfunctional vinyl aromatic copolymer contains, at a terminal thereof, a terminal group represented by Formulae (t1), (t2), and (t3) and derived from the divinyl aromatic compound (a), styrene (b), and the monovinyl aromatic compound (c) other than styrene:

(t1)

in the formula, $R^2$ represents a C6 to C30 aromatic hydrocarbon group; $Z^1$ represents a vinyl group, a hydrogen atom, or a C1 to C18 hydrocarbon group; and * represents a bonding site with a main chain; the same applies hereafter;

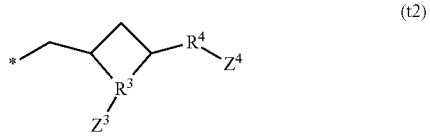
(t2)

in the formula, $R^3$ and $R^4$ represent each independently a C6 to C30 aromatic hydrocarbon group; and $Z^3$ and $Z^4$ represent each independently a vinyl group, a hydrogen atom or a C1 to C18 hydrocarbon group;

(t3)

in the formula, $R^5$ represents a C6 to C30 aromatic hydrocarbon group; and $Z^5$ represents a vinyl group, a hydrogen atom, or a C1 to C18 hydrocarbon group;

a mole fraction of a sum total of structural units of Formula (a1) and terminal groups of Formulae (t1), (t2), and (t3) with respect to a sum total of the divinyl aromatic compound (a), styrene (b), and the monovinyl aromatic compound (c) other than styrene lies in the range of 0.02 to 0.8;

an introduction amount in the copolymer of a terminal group (tv) having a vinyl group is 0.2 or more per molecule; and a mole fraction of Formula (t3) with respect to a sum total of terminal groups of Formulae (t1), (t2), and (t3) is 0.7 or less; and wherein the copolymer has a number-average molecular weight of 300 to 100,000, a molecular weight distribution Mw/Mn, denoted by a ratio of weight-average molecular weight and number-average molecular weight, of 100 or lower, and is soluble in toluene, xylene, tetrahydrofuran, dichloroethane or chloroform.

2. A method for producing the soluble polyfunctional vinyl aromatic copolymer of claim 1, the method being a method for producing a polyfunctional vinyl aromatic copolymer through polymerization of the divinyl aromatic compound (a), the styrene (b), and the monovinyl aromatic compound (c) other than styrene, in the presence of a Lewis acid catalyst (f) and a Lewis base compound (g), wherein the divinyl aromatic compound (a) is used in an amount of 2 mol % or more and less than 95 mol %, and the styrene (b) and the monovinyl aromatic compound (c) other than styrene are used in an amount of 5 mol % or more and less than 98 mol %, with respect to a sum total of (a), (b), and (c), and polymerization is carried out at a temperature of −20° C. to 120° C.

3. The method for producing the soluble polyfunctional vinyl aromatic copolymer according to claim 2, wherein the Lewis acid catalyst (0 is a metal fluoride or a complex thereof.

4. The method for producing the soluble polyfunctional vinyl aromatic copolymer according to claim 2, wherein the Lewis base compound (g) is one or more compound selected from the group consisting of ester-based compounds, ketone-based compounds, and ether-based compounds.

5. A curable resin composition, containing the soluble polyfunctional vinyl aromatic copolymer according to claim 1, and a radical polymerization initiator (h).

6. The curable resin composition according to claim 5, further comprising a flame retardant and/or a filler.

7. A cured product, obtained through curing of the curable resin composition of claim 5.

8. A curable composite material, comprising: the curable resin composition of claim 5, and a base material, wherein a proportion of a content of the base material is 5 to 90 wt %.

9. A cured composite material, obtained through curing of the curable composite material of claim 8.

10. A laminate, having a layer of the cured composite material of claim 9, and a metal foil layer.

11. A metal foil with resin, having a film formed from the curable resin composition of claim 5, on one side of a metal foil.

12. A varnish for circuit board materials, obtained through dissolution of the curable resin composition of claim 5 in an organic solvent.

13. A curable resin composition, containing the soluble polyfunctional vinyl aromatic copolymer according to claim 1, and a curable reactive resin or a thermoplastic resin.

14. The curable resin composition according to claim 13, wherein the curable reactive resin is a modified polyphenylene ether compound terminally modified with a substituent having a carbon-carbon unsaturated double bond, an epoxy resin having two or more epoxy groups per molecule, or a vinyl compound having one or more unsaturated hydrocarbon groups in the molecule.

15. A cured product, obtained through curing of the curable resin composition of claim 13.

16. A curable composite material, comprising: the curable resin composition of claim 13, and a base material, wherein a proportion of a content of the base material is 5 to 90 wt %.

17. A cured composite material, obtained through curing of the curable composite material of claim 16.

18. A laminate, having a layer of the cured composite material of claim 17, and a metal foil layer.

19. A metal foil with resin, having a film formed from the curable resin composition of claim 13, on one side of a metal foil.

20. A varnish for circuit board materials, obtained through dissolution of the curable resin composition of claim 13 in an organic solvent.

* * * * *